United States Patent [19]
Yiu et al.

[11] Patent Number: 5,526,307
[45] Date of Patent: Jun. 11, 1996

[54] FLASH EPROM INTEGRATED CIRCUIT ARCHITECTURE

[75] Inventors: Tom D. Yiu, Milpitas, Calif.; Fuchia Shone, Hsinchu, Taiwan; Tien-Ler Lin, Cupertino, Calif.; Ray L. Wan, Milpitas, Calif.

[73] Assignee: Macronix International Co., Ltd., Hsincho, Taiwan

[21] Appl. No.: 325,467

[22] PCT Filed: Sep. 13, 1994

[86] PCT No.: PCT/US94/10331

§ 371 Date: Oct. 26, 1994

§ 102(e) Date: Oct. 26, 1994

Related U.S. Application Data

[63] Continuation-in-part of Ser. No. 187,118, Jan. 25, 1994, Pat. No. 5,399,891, which is a continuation of Ser. No. 823,882, Jan. 22, 1992, abandoned.

[51] Int. Cl.⁶ .................................................. H01L 29/788
[52] U.S. Cl. .............................. 365/185.01; 365/189.02; 365/189.09; 365/185.33; 257/316
[58] Field of Search ..................................... 365/185, 900, 365/189.01, 189.02, 189.09; 257/316

[56] References Cited

U.S. PATENT DOCUMENTS

| | | |
|---|---|---|
| 4,258,378 | 3/1981 | Wall . |
| 4,639,893 | 1/1987 | Eitan . |

(List continued on next page.)

FOREIGN PATENT DOCUMENTS

| | | |
|---|---|---|
| 0298430A2 | 1/1989 | European Pat. Off. . |
| 0422347A2 | 9/1989 | European Pat. Off. . |
| 0354858A1 | 2/1990 | European Pat. Off. . |
| 461764A2 | 6/1990 | European Pat. Off. . |
| 0386631A2 | 9/1990 | European Pat. Off. . |
| 0461764A3 | 12/1991 | European Pat. Off. . |
| 0552531A1 | 7/1993 | European Pat. Off. . |
| 2241380 | 11/1990 | United Kingdom . |

OTHER PUBLICATIONS

M. Inoue, et al., "A 16 Mb DRAM with an Open Bit Line Architecture" ISSCC Solid State Circuits Conference, San Francisco, Feb. 1988, pp. 246–248.

M. Okada, et al., "16 Mb ROM Design using Bank Select Architecture" IEEE Symposium on VLSI Circuits, Tokyo, 1988.

W. Kammerer, et al., "A New Virtual Ground Array Architecture for Very High Speed, High Density EPROMS", IEEE Symposium on VLSI Circuits, OISO, May 1991, pp. 83–84.

(List continued on next page.)

*Primary Examiner*—Ngân V. Ngô
*Attorney, Agent, or Firm*—Haynes & Davis

[57] ABSTRACT

Contactless flash EPROM cell and array designs, and methods for fabricating the same result in a dense, segmentable flash EPROM chip. The flash EPROM cell is based on a drain-source-drain configuration, in which the single source diffusion is shared by two columns of transistors. The module includes a memory array having at least M rows and 2N columns of flash EPROM cells. M word lines, each coupled to the flash EPROM cells in one of the M rows of the flash EPROM cells, and N global bit lines are included. Data in and out circuitry is coupled to the N global bit lines which provide for reading and writing data in the memory array. Selector circuitry, coupled to the 2N columns of flash EPROM cells, and to the N global bit lines, provides for selective connection of two columns of the 2N columns to each of the N global bit lines so that access to the 2N columns of flash EPROM cells by the data in and out circuitry is provided across N global bit lines. The semiconductor substrate has a first conductivity type, a first well in the substrate of a second conductivity type, and a second well of the first conductivity type in the first well. The flash EPROM cells are made in the second well to allow application of a negative potential to at least one of the source and drain during an operation to charge the floating gate in the cells.

36 Claims, 17 Drawing Sheets

U.S. PATENT DOCUMENTS

| | | |
|---|---|---|
| 4,698,787 | 10/1987 | Mukherjee et al. . |
| 4,780,424 | 10/1988 | Holler et al. . |
| 4,792,925 | 12/1988 | Corda et al. . |
| 4,947,378 | 8/1990 | Jinbo et al. . |
| 4,949,309 | 8/1990 | Rao et al. . |
| 4,972,378 | 11/1990 | Kitigawa et al. . |
| 5,023,681 | 6/1991 | Ha . |
| 5,023,837 | 6/1991 | Schreck et al. . |
| 5,028,979 | 7/1991 | Mazzali . |
| 5,045,489 | 9/1991 | Gill et al. . |
| 5,060,195 | 10/1991 | Gill et al. . |
| 5,095,461 | 3/1992 | Miyakawa et al. . |
| 5,110,753 | 5/1992 | Gill et al. . |
| 5,111,428 | 5/1992 | Liang et al. . |
| 5,121,353 | 6/1992 | Natori ................................. 365/145 |
| 5,127,739 | 7/1992 | Duvvury et al. . |
| 5,168,335 | 12/1992 | D'Arrigo et al. . |
| 5,204,835 | 4/1993 | Eitan . |
| 5,229,968 | 7/1993 | Ito et al. . |
| 5,245,570 | 9/1993 | Fazio et al. . |
| 5,297,081 | 3/1994 | Challa ................................. 365/184 |
| 5,315,541 | 5/1994 | Harari et al. . |
| 5,325,327 | 6/1994 | Emr ..................................... 365/185 |
| 5,399,891 | 3/1995 | Yin et al. ............................ 257/316 |

OTHER PUBLICATIONS

Eitan, et al., "Alternate Metal Virtual Ground (AMG)—A New Scaling Concept for Very High–Density EPROM's"; IEEE Electron Device Letters, vol. 12, No. 8, Aug. 1991, pp. 450–452.

H. Pein, et al., "A 3–D Sidewall Flash EPROM Cell and Memory Array"; IEEE Electron Device Letters, vol. 14, No. 8, Aug. 1993, pp. 415–417.

H. Pein, et al., "Performance of the 3–D Sidewall Flash EPROM Cell"; IEEE, 1993.

S. Yamada, et al., "Degradation Mechanism of Flash EEPROM Programming After Program/Erase Cycles"; IEEE 1993.

H. Kume, et al., "A 1.28 $\mu m^2$ Contactless Memory Cell Technology for a 3V–Only 64 Mbit EEPROM"; IEDM 1992.

A. Bergemont, et al., "NOR Virtual Ground (NVG)—A New Scaling Concept for Very High Density Flash EEPROM and its Implementation in a 0.5 $\mu m$ Process"; IEEE, 1993.

H. Onoda, et al., "A Novel Cell Structure Suitable for a 3 Volt Operation, Sector Erase and Flash Memory"; IEEE, 1992.

R. Kazerounian, et al., "Alternate Metal Virtual Ground EPROM Array Implemented in a 0.8 $\mu m$ Process for Very High Density Applications"; IEEE 1991, pp. 11.5.1–11.5.4.

N. Kodama, et al., "A Symmetrical Side Wall (SSW)–DSA Cell for a 64 Mbit Flash Memory" IEEE 1991; pp. 11.3.1–11.3.4.

M. McConnell, et al., "An Experimental 4–Mb Flahs EEPROM with Sector Erase" Journal of Solid Circuits, vol. 26, No. 4; Apr. 1991; pp. 484–489.

B. J. Woo, et al., "A Novel Memory Cell Using Flash Array Contactless EPROM (FACE) Technology"; IEEE 1990; pp. 5.1.1–5.1.4.

B. J. Woo, et al., "A Poly–Buffered FACE Technology for High Density Flash Memories" Symposium on VLSI Technology, pp. 73–74.

FIG.—2

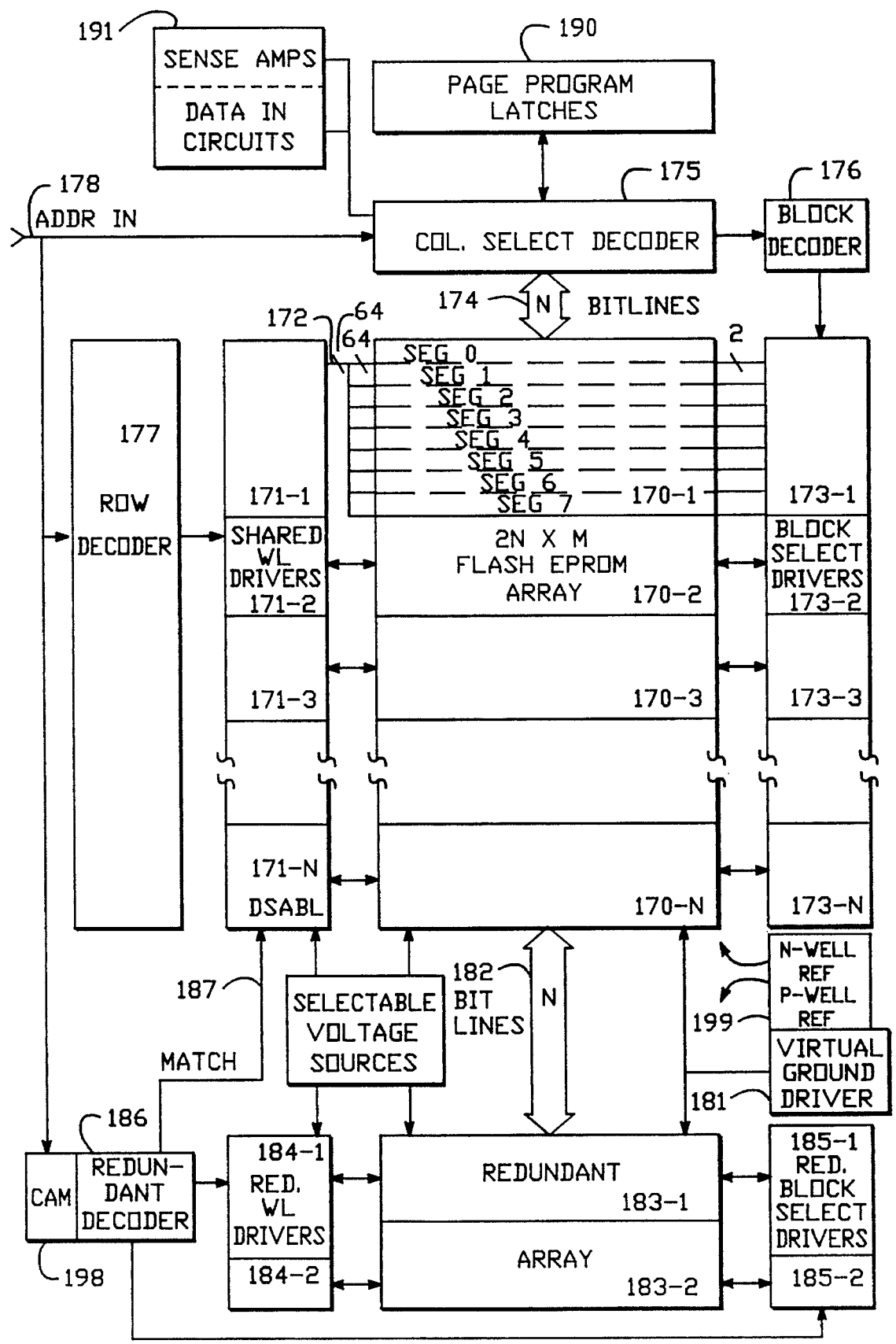
FIG.—4

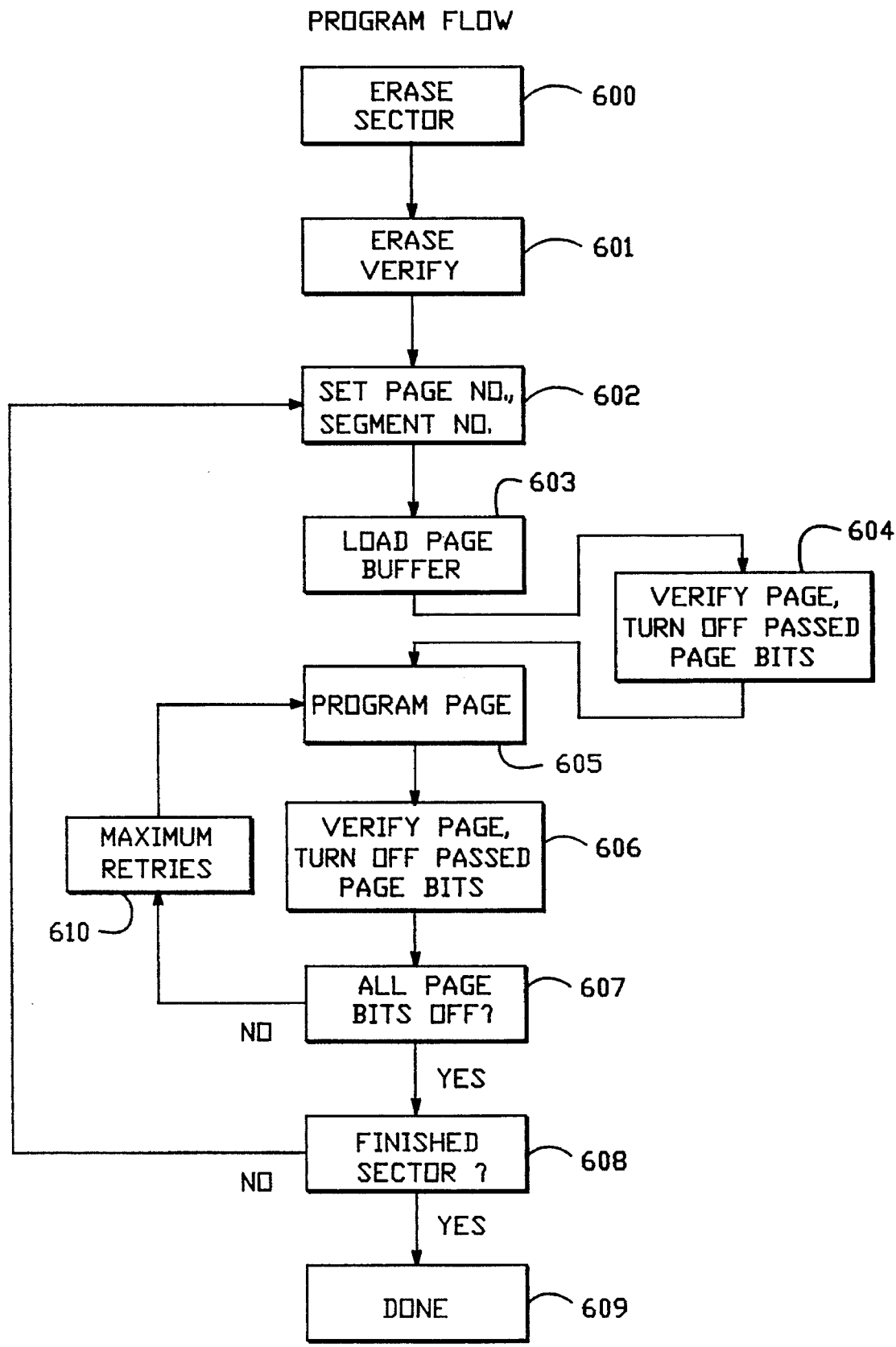
FIG.—4A

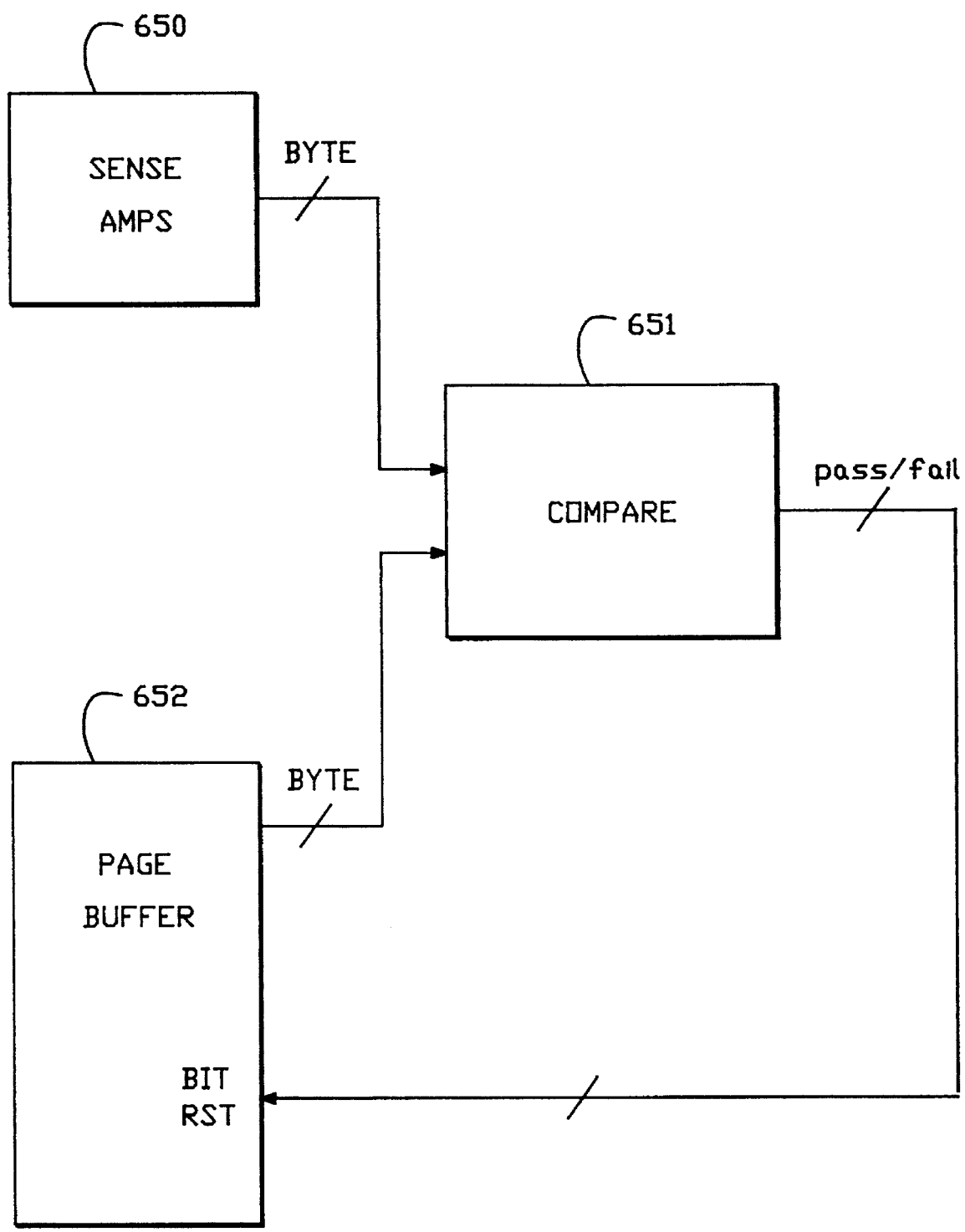
FIG.—4B

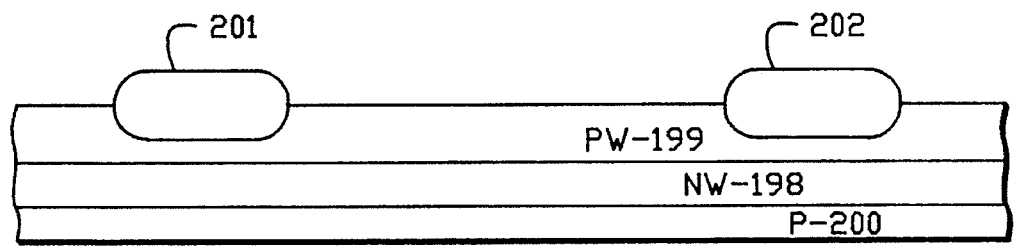
FIG.—5A
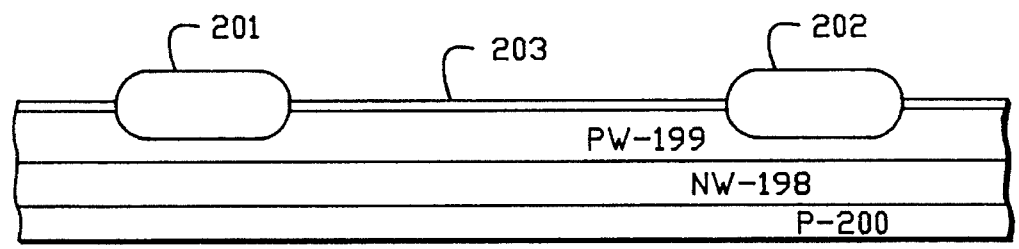
FIG.—5B
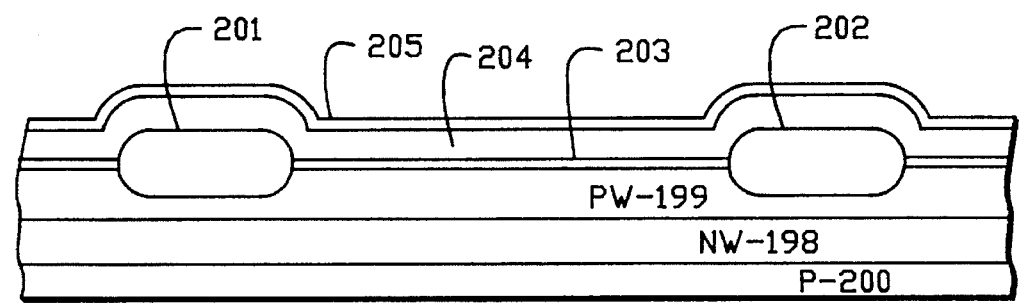
FIG.—5C
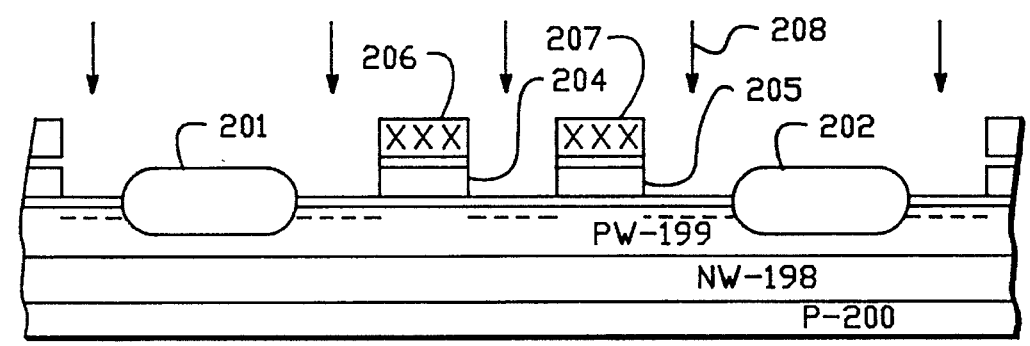
FIG.—5D

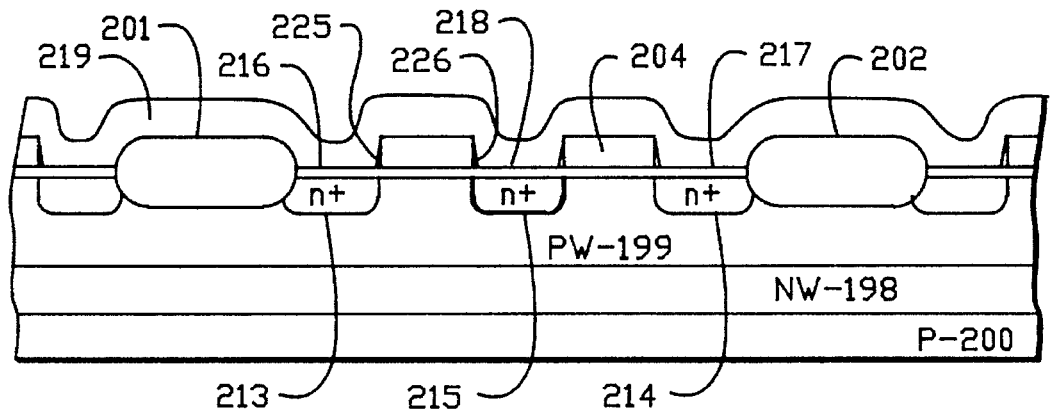
FIG.—5E
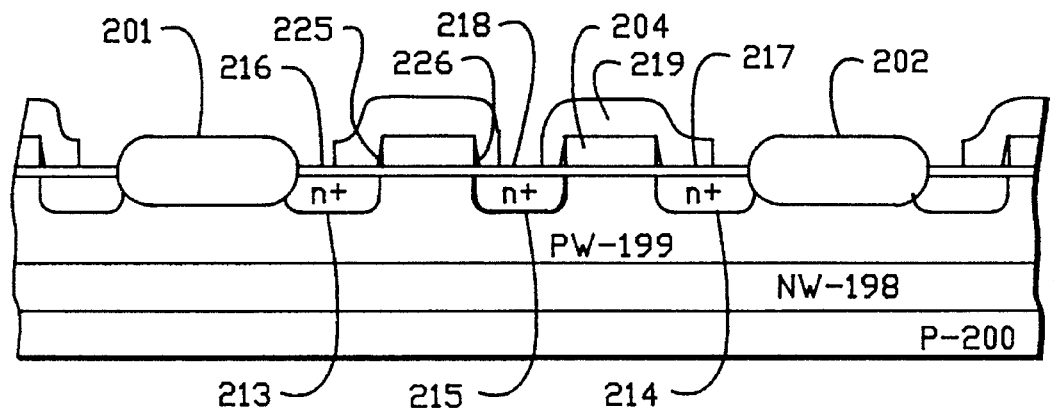
FIG.—5F
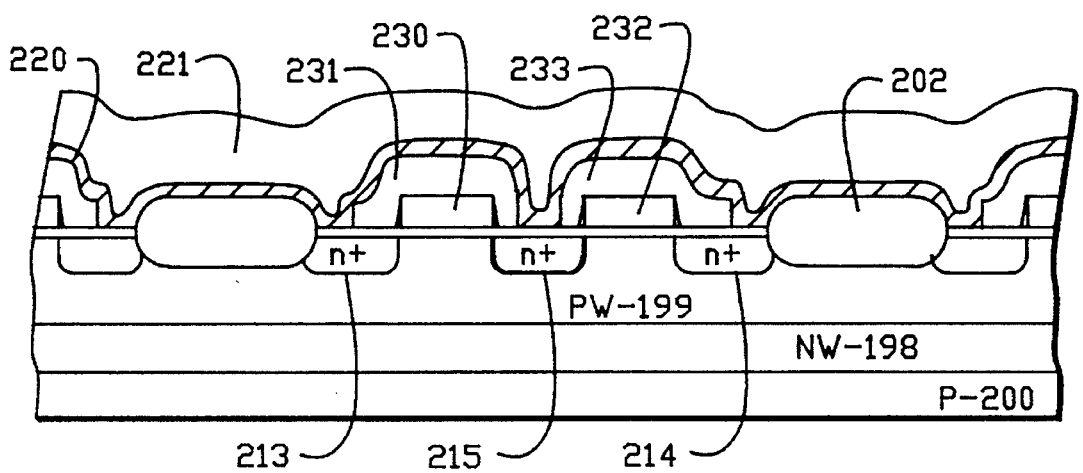
FIG.—5G

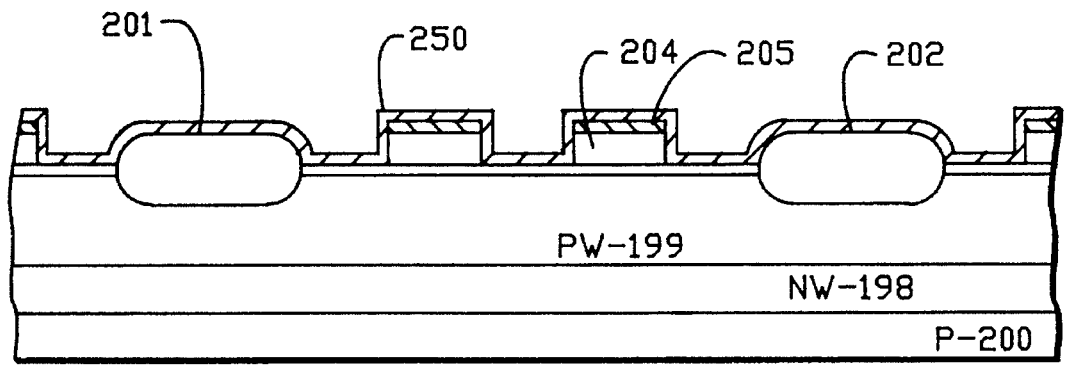
FIG.—6A
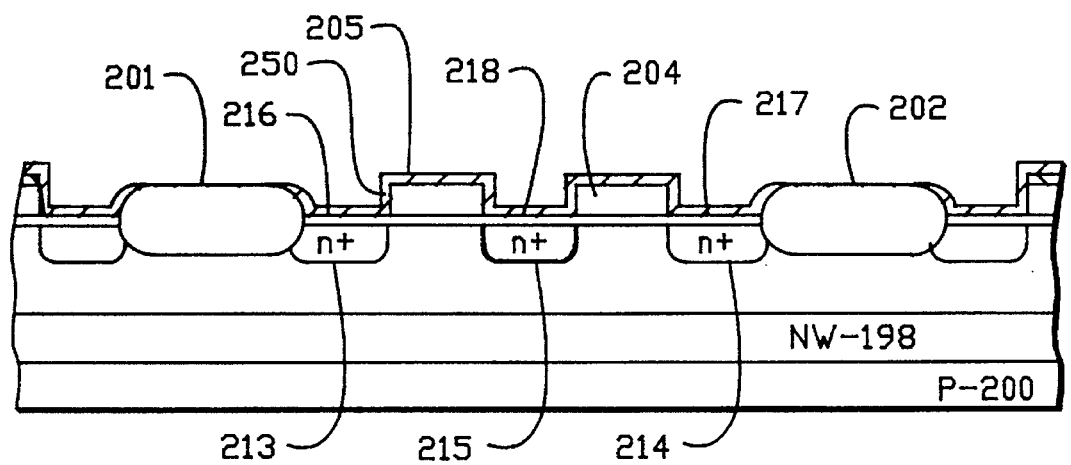
FIG.—6B
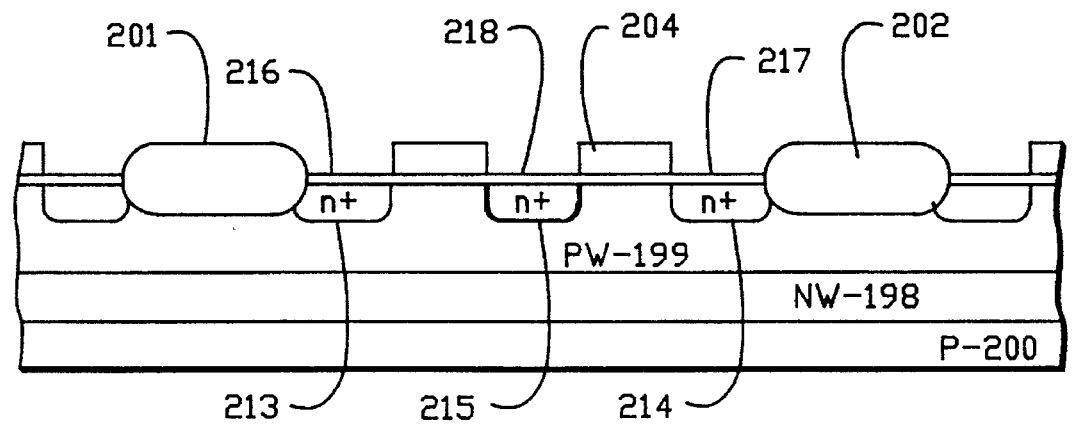
FIG.—6C

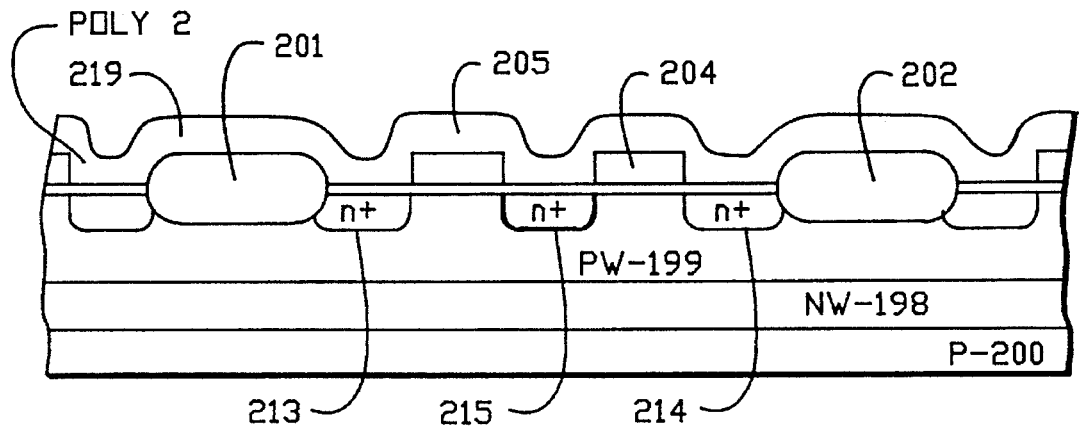
FIG.—6D
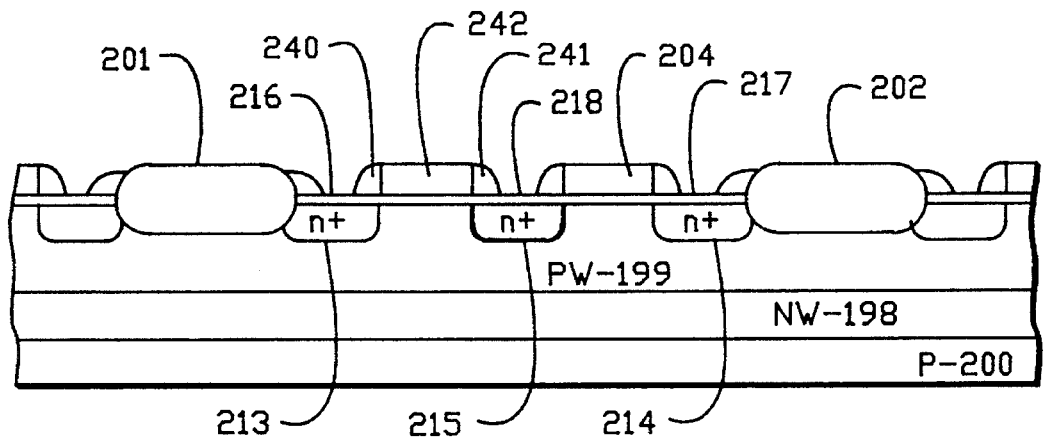
FIG.—6E
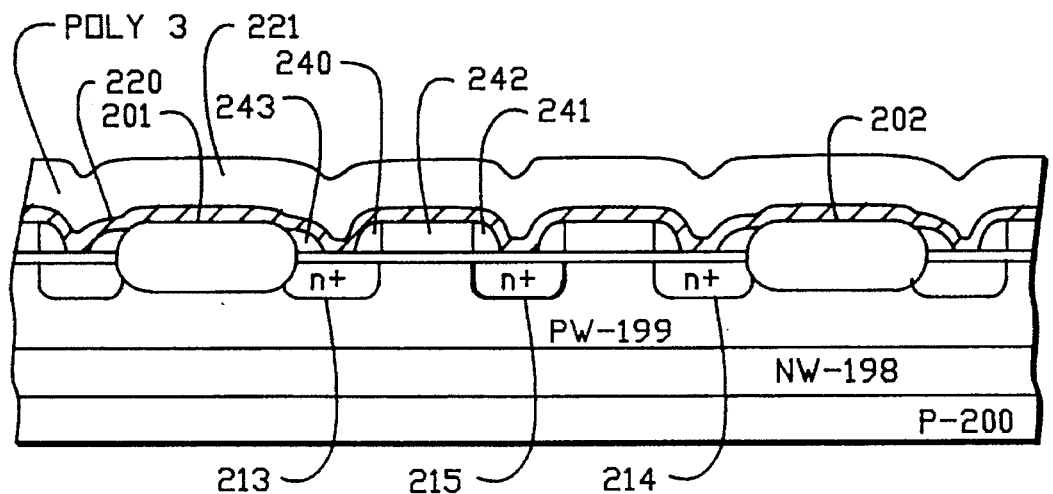
FIG.—6F

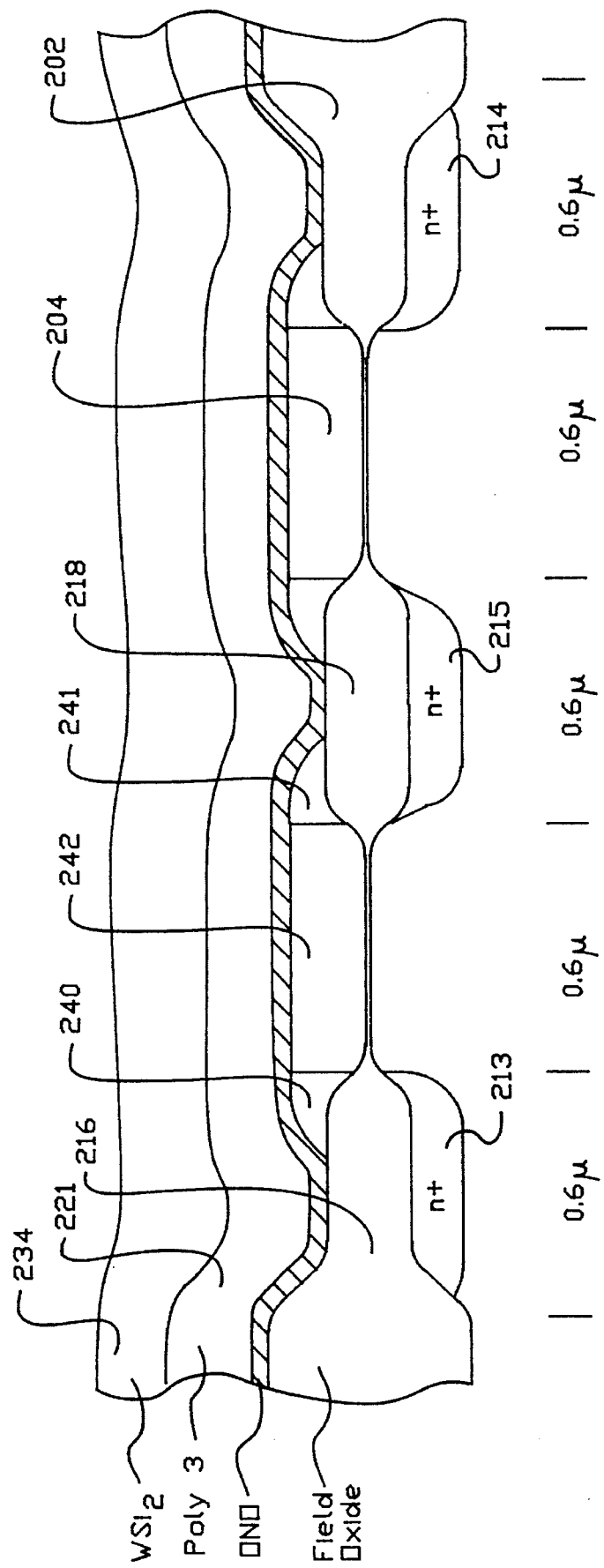
FIG.—6G

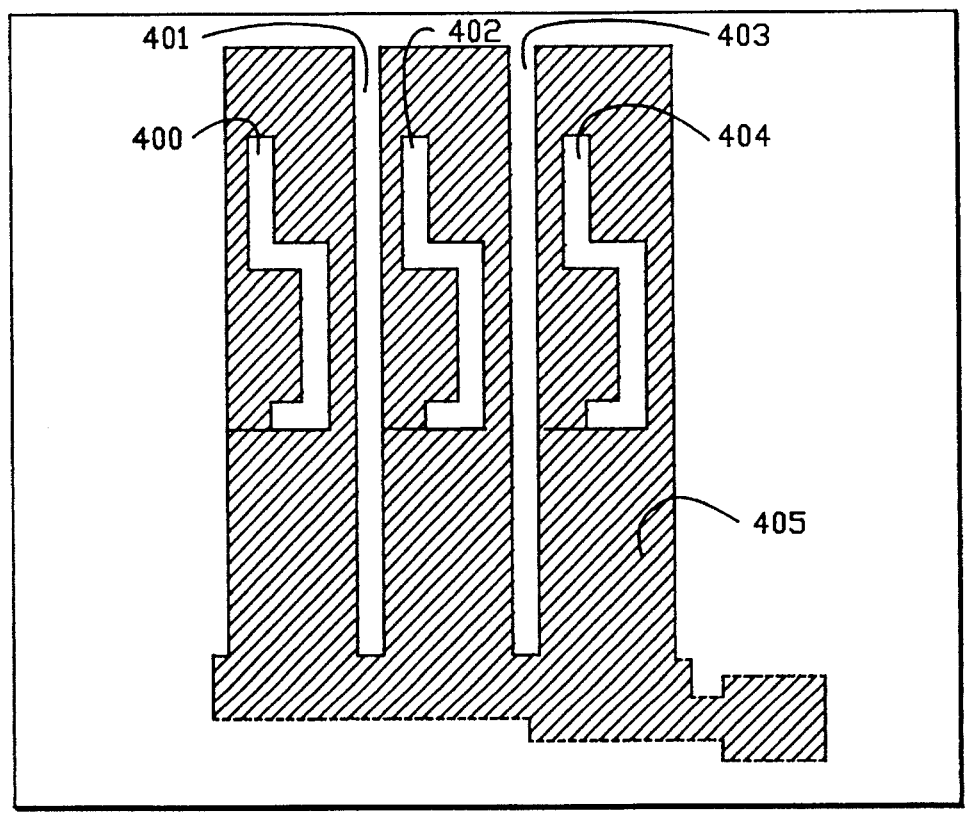
FIG.—8
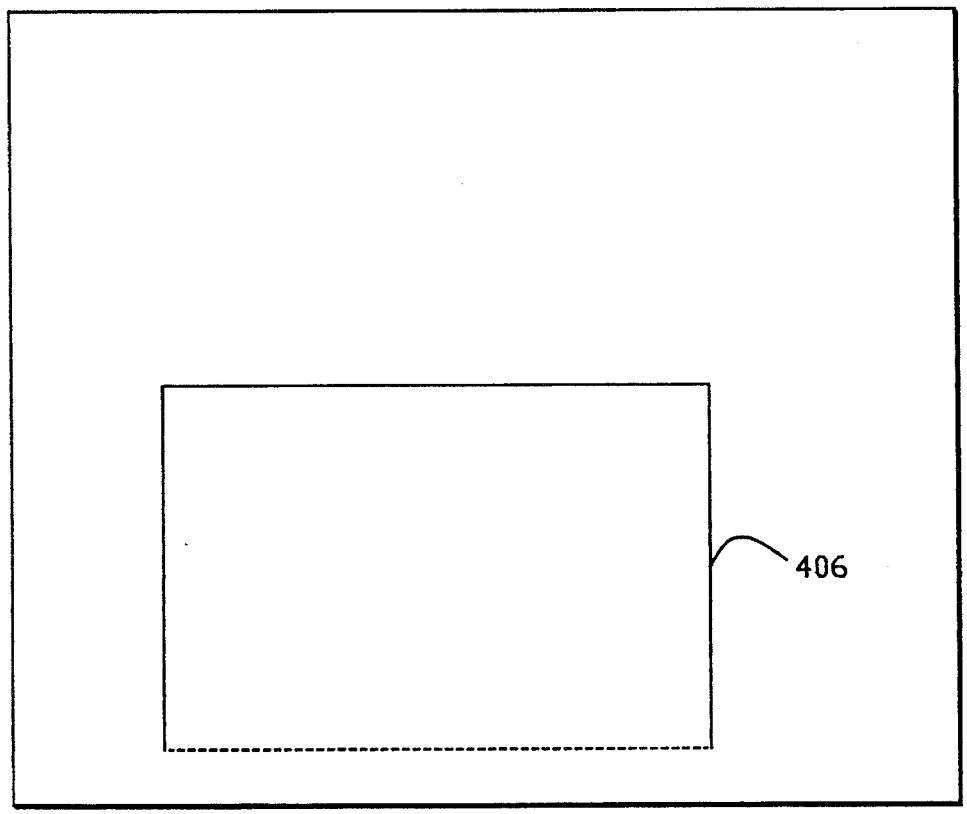
FIG.—9

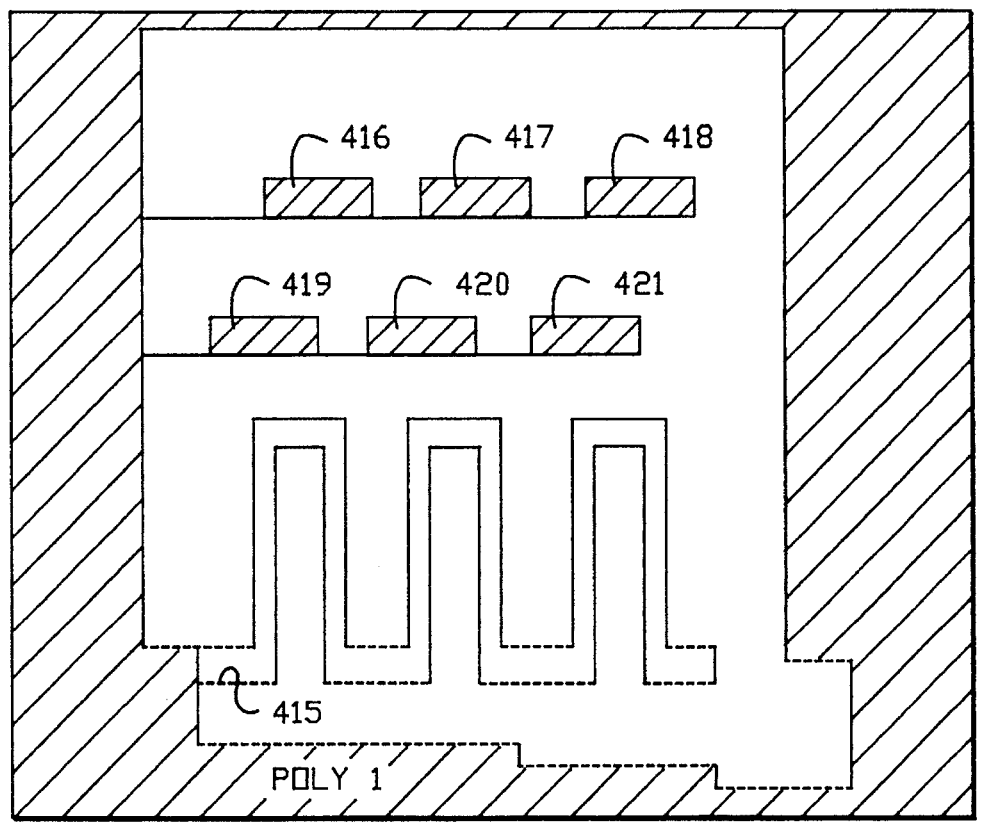
FIG.—10
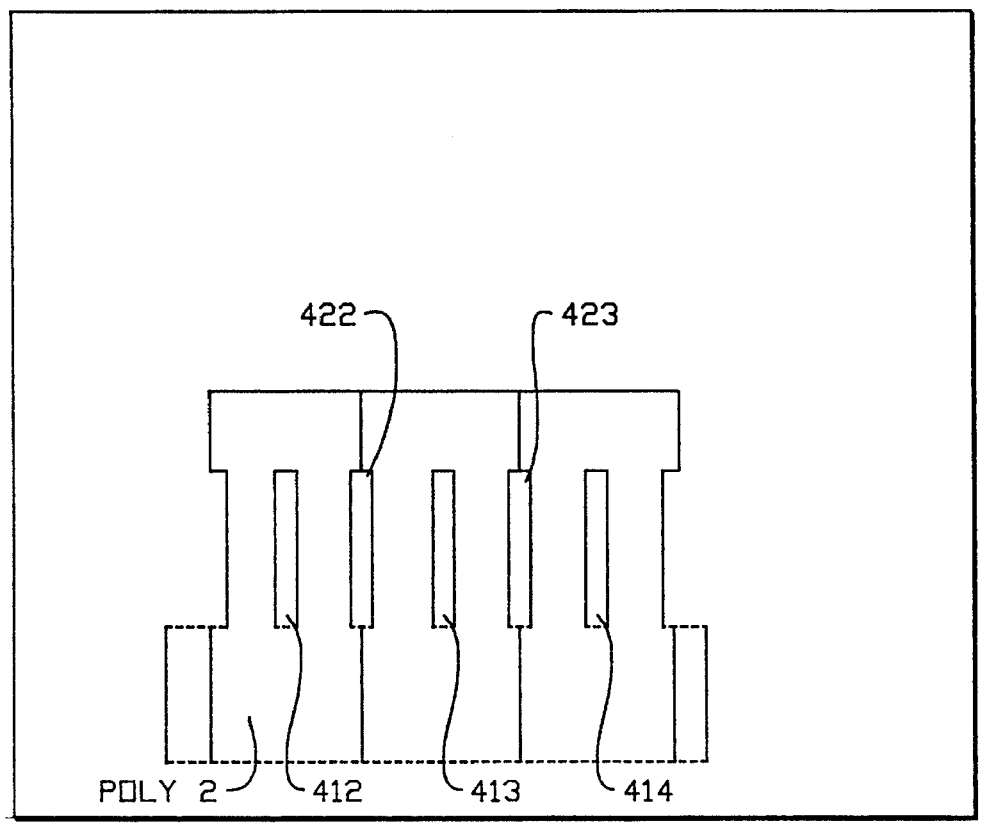
FIG.—11

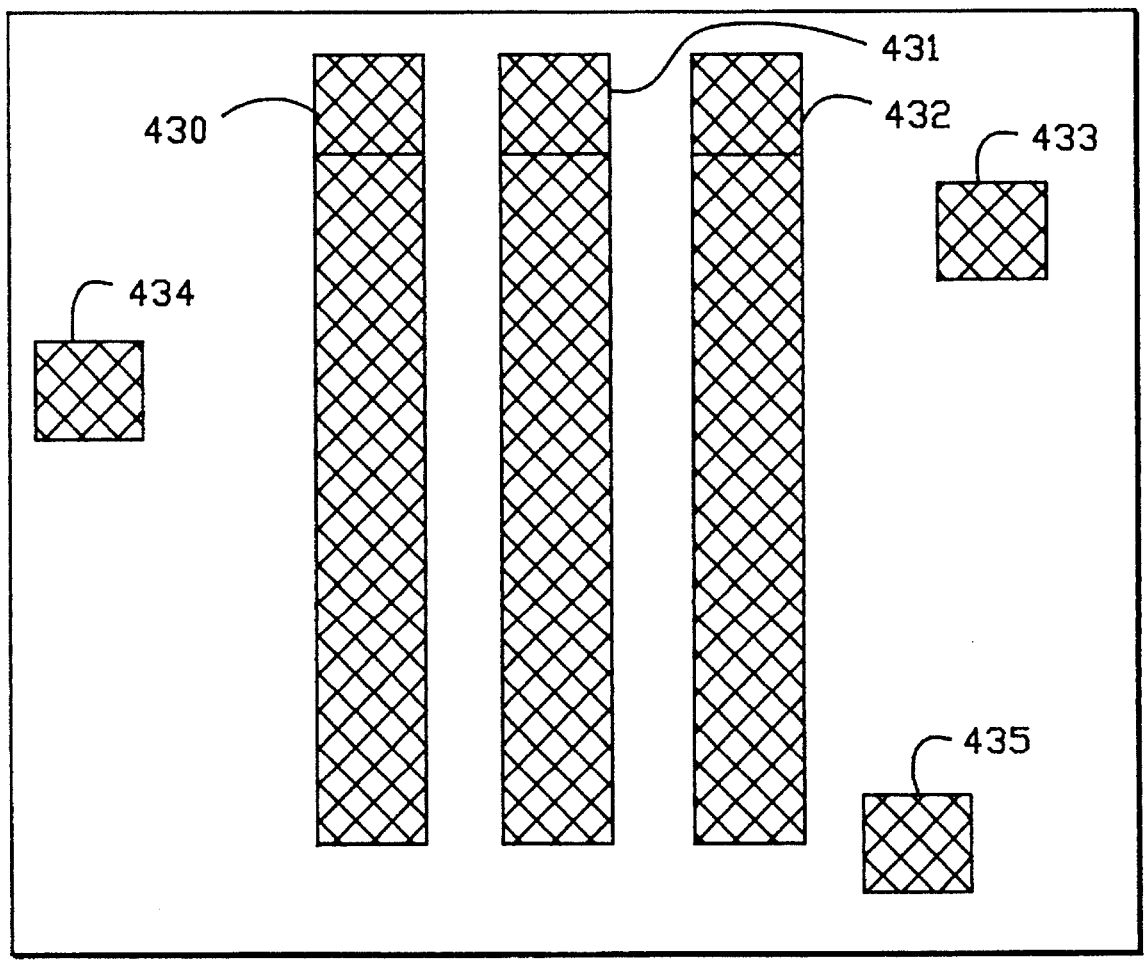
FIG.—14

5,526,307

FLASH EPROM INTEGRATED CIRCUIT ARCHITECTURE

CONTINUATION APPLICATION DATA

The present application is a continuation-in-part of prior filed U.S. application Ser. No. 08/187,118, filed 25 Jan. 1994, now U.S. Pat. No. 5,399,891 which is a continuation of U.S. application Ser. No. 07/823,882, filed 22 Jan. 1992, invented by Yiu, et al., now abandoned.

RELATED APPLICATION DATA

The present application is related to co-pending application entitled A FLASH EPROM TRANSISTOR ARRAY AND METHOD FOR MANUFACTURING THE SAME, filed on the same day as the present application, invented by Shone, et al., and owned by the same Assignee as the present application now and at the time of invention.

BACKGROUND OF THE INVENTION

1. Field of the Invention

The present invention relates to flash EPROM memory technology, and more particularly to an improved flash EPROM memory architecture and data cell structure.

2. Description of Related Art

Flash EPROMs are a growing class of non-volatile storage integrated circuits. These flash EPROMs have the capability of electrically erasing, programming, and reading a memory cell in the chip. The memory cell in a flash EPROM is formed using so-called floating gate transistors in which the data is stored in a cell by charging or discharging the floating gate. The floating gate is a conductive material, typically made of polysilicon, which is insulated from the channel of the transistor by a thin layer of oxide, or other insulating material, and insulated from the control gate or word line of the transistor by a second layer of insulating material.

Data is stored in the memory cell by charging or discharging the floating gate. The floating gate is charged through a Fowler-Nordheim tunneling mechanism by establishing a large positive voltage between the gate and source or drain. This causes electrons to be injected into the floating gate through the thin insulator. Alternatively, an avalanche injection mechanism may be used by applying potentials to induce high energy electrons in the channel of the cell which are injected across the insulator to the floating gate. When the floating gate is charged, the threshold voltage for causing the memory cell to conduct is increased above the voltage applied to the word line during a read operation. Thus, when a charged cell is addressed during a read operation, the cell does not conduct. The non-conducting state of the cell can be interpreted as a binary 1 or 0 depending on the polarity of the sensing circuitry.

The floating gate is discharged to establish the opposite memory state. This function is typically carried out by F-N tunneling mechanism between the floating gate and the source or the drain of the transistor, or between the floating gate and the substrate. For instance, the floating gate may be discharged through the source by establishing a large positive voltage from the source to the gate, while the drain is left at a floating potential.

The high voltages used to charge and discharge the floating gate place significant design restrictions on flash memory devices, particularly as the cell dimensions and process specifications are reduced in size.

Details concerning the structure and function of prior art flash EPROMs can be seen upon review of the following U.S. Patents which are incorporated by reference for the purpose of teaching the background of related technology:

Bergemont, et al., U.S. Pat. No. 5,012,446, issued Apr. 30, 1991;

Mukherjee, et al., U.S. Pat. No. 4,698,787, issued Oct. 6, 1987; and

Holler, et al., U.S. Pat. No. 4,780,423, issued Oct. 25, 1988.

Additional advanced technology concerning flash EPROM integrated circuits is set out in Belleza, European Patent Application No. 901040002.2, published Sep. 12, 1990; Woo, et al., "A Novel Memory Cell Using Flash Array Contactless EPROM (FACE) Technology" IEDM 1990, published by the IEEE, pages 91–94. Also, Woo, et al., "A Poly-Buffered "FACE" Technology for High Density Memories", 1991 SYMPOSIUM ON VLSI TECHNOLOGY, pages 73–74. One prior art "contactless" array EPROM architecture is described in Kazerounian, et al, "Alternate Metal Virtual Ground EPROM Array Implemented in A 0.8 μM Process for Very High Density Applications", IEDM, published by IEEE 1991, pages 11.5.1–11.5.4.

As evidence by the Bergemont, et al., patent and the Belleza, Woo, et al., and Kazerounian, et al., publications, there is increasing interest in contactless array non-volatile memory design. So-called contactless arrays include an array of storage cells which are coupled to one another by buried diffusion, and the buried diffusion is only periodically coupled through contacts to a metal bit line. Earlier flash EPROM designs such as the Mukherjee, et al., system required a "half" metal contact for each memory cell. Because metal contacts use a significant area on an integrated circuit, they are a major impediment to creating a high density memory technology. Furthermore, as the device becomes smaller and smaller, the area reduction becomes limited by the metal over contact pitches of adjacent drain and source bit lines used to access the storage cells in the array.

Therefore, it is desirable to provide a flash EPROM cell, architecture, and a method of fabricating the same which results in a high density non-volatile memory circuit, and which overcomes some of the problems associated with the high program and erase voltages.

SUMMARY OF THE INVENTION

The present invention provides novel contactless flash EPROM cell and array designs, and methods for fabricating the same which result in a dense, segmentable flash EPROM chip. The flash EPROM cell is based on a unique drain-source-drain configuration, in which a single source diffusion is shared by two columns of transistors. Also, a new memory circuit architecture suited for the flash EPROM cells of the present invention is provided.

Thus, according to one aspect of the present invention, a flash EPROM transistor array is provided. An elongated first drain diffusion region, an elongated source diffusion region, and an elongated second drain diffusion region, are formed in a semiconductor substrate along essentially parallel lines. Field oxide regions are grown on opposite sides of the first and second drain diffusion regions. Floating gates and control gate word lines are formed orthogonal to the drain-source-drain structure to establish two columns of storage cells having a shared source region. The shared source region is coupled to a virtual ground terminal. The drain diffusion regions are coupled through select transistors to global bit lines. The cell structure according to one aspect of the invention uses one metal global bit line which extends essentially parallel to the drain, source and drain diffusion regions for two columns of cells, and a virtual ground supply which coupled a plurality of columns of transistors to a virtual ground terminal through a horizontal conductor, such as a buried diffusion line. Thus, only one metal contact pitch is required for the two columns of flash EPROM cells in each drain-source-drain structure.

Thus, according to one aspect of the present invention, a flash EPROM integrated circuit module on a semiconductor substrate is provided. The module includes a memory array having at least M rows and 2N columns of flash EPROM cells. M word lines, each coupled to the flash EPROM cells in one of the M rows of the flash EPROM cells, and N global bit lines are included. Data in and out circuitry is coupled to the N global bit lines which provide for reading and writing data in the memory array. Selector circuitry, coupled to the 2N columns of flash EPROM cells, and to the N global bit lines, provides for selective connection of two columns of the 2N columns to each of the N global bit lines so that access to the 2N columns of flash EPROM cells by the data in and out circuitry is provided across N global bit lines. Also, the structure can be extended to provide for sharing one metal bit line among mare than 2 columns of cells.

The array, according to another aspect, includes a plurality of segments of drain-source-drain structures, as described above. The selector circuitry, in this embodiment, includes segment selector circuitry, coupled to two local bit lines provided by the drain diffusion regions in the segment. The segment selector circuitry provides for selective connection of the first and second columns of cells within a given segment to one of the N bit lines. Thus, where the drain diffusion regions provide local bit lines, the selector circuitry includes a first transistor having a first terminal in the first drain diffusion region of the structure, and a second terminal coupled to a contact to one of the N global bit lines. The second transistor has a first terminal coupled to the second drain diffusion region of the structure and a second terminal coupled to the contact. The first and second transistors are independently controlled by left and right select lines which are parallel to the word lines.

The array is made further compact by reducing the number of word line drivers necessary. According to this aspect, each word line driver drives a plurality of word lines in parallel, such as eight. Each of the word lines driven by a given word line driver is in a different segment of each column of segments which makes up the array. Thus, the selected word line is decoded by the segment select circuitry as well as the word line decoding circuitry. This greatly compacts the layout of array by requiring only one word line driver for eight word lines.

According to yet another aspect of the present invention, the semiconductor substrate has a first conductivity type, a first well in the substrate of a second conductivity type, and a second well of the first conductivity type in the first well. The flash EPROM cells are made in the second well to allow application of a negative potential to at least one of the source and drain during an operation to charge the floating gate in the cells. This substantially reduces the magnitude of the high positive voltage which must be applied to the gate to induce F-N tunneling for cells to be charged. The array, according to the present invention, also uses a negative potential on the gate of cells to be discharged. This substantially reduces the magnitude of the potential which must be applied to the drain to induce F-N tunneling to discharge the cell. The lower magnitude voltages used substantially relax the specifications for the integrated circuit components which handle the program and erase voltages, making the device more economical and easier to manufacture. At the same time, the endurance of the memory is improved by reducing hot hole generation during program mode.

According to another aspect of the present invention, the array is configured so that the "erased" condition corresponds to a charged floating gate, so that the erased cell is non-conducting when addressed, and the "programmed" condition results from discharging the cell, so that the programmed cell is conducting when addressed. This allows an erase operation to occur without pre-programming.

According to yet another aspect of the present invention, the array includes redundant rows of flash EPROM cells. The redundant rows are used to replace a row in the main array which is addressed with a single word line or set of word lines coupled to a single driver. Because of the discharged condition corresponding to a programmed state, and the use of the negative potentials for programming and erasing, as outlined above, the row redundancy is enabled. Prior art flash EPROM cells could not use row redundancy because of the disturbance caused by the failed row in the main array. In particular, because the failed row could not be isolated from the program and/or erased potentials in the main array, the cells in the failed row would progress to an over-erase condition, contributing to leakage current on the array, and eventually causing failure of columns.

Thus, a flash EPROM integrated circuit module, according to the present invention, can be made using a two well process, in which the semiconductor substrate has the first conductivity type in the semiconductor substrate, a first well of a second conductivity type in the substrate, and a second well of the first conductivity type in the first well. An array of flash EPROM cells is formed in the second well, when the array includes 2N columns of flash EPROM cells and M rows. The 2N columns of flash EPROM cells comprise N pairs of columns of flash EPROM cells, each pair of columns includes a plurality of segments. Each segment in the plurality comprises a first drain diffusion region elongated in a first direction in the second well, a source diffusion region elongated in the first direction in the second well and spaced away from the first drain diffusion region, and a second drain diffusion region elongated in the first direction in the second well and spaced away from the source diffusion region. This provides a drain-source-drain structure that provides for two columns of flash EPROM cells within a given segment.

A first insulating layer is placed over the substrate, over the first and second channel regions formed between the drain-source-drain structures, and over the source and drain diffusion regions. Floating gate electrodes are applied over the first insulating layer for the two columns of cells in the segment. The second insulating layer is placed over the floating gate electrodes. This results in each segment including a first set of flash EPROM cells in a first one of a pair of columns, and a second set of flash EPROM cells in a second one of the pair of columns.

M word lines, each coupled to the flash EPROM cells in the one of the M rows of flash EPROM cells are included. Members of a subset of the M word lines are each coupled to a flash EPROM cell in the first set in a given segment, and a flash EPROM cell in the second set in a given segment. Thus, each word line intersects two cells in each pair of columns within a given segment.

The array includes N global bit lines. Data in and out circuitry is coupled to the N global bit lines to provide for reading and writing data (using a program and/or erase sequence) in the 2N columns of flash EPROM cells.

Selector circuitry is coupled to the first and second drain diffusions in each of the plurality of segments, which provides connection of the 2N columns of flash EPROM cells to the N global bit lines. The selector circuitry provides for selective connection of two columns of the 2N columns to each of the N global bit lines, so that access to the 2N columns of flash EPROM cells by the data in and out circuitry is provided across the N global bit lines.

Program and erase circuitry applies a negative potential to the global bit lines during an operation to charge the floating gate of selected flash EPROM cells; and applies a negative potential to the word lines during an operation to discharge the floating gate of selected flash EPROM cells; such that the magnitude of positive voltages required on other terminals is reduced.

Thus, a unique array architecture is provided with a virtual ground configuration to achieve a high packing density. The basic unit of the memory array includes segments of two columns of cells in a drain-source-drain configuration. The resulting array structure gives less program and erase disturbance problems to the neighboring unselected bit lines. It also reduces the complexity of the Y decoder design as compared to an array structure which is configured as a source-drain-source-drain array.

In the array layout, two cells share one metal pitch, which can further relax metal pitch design rules. Decoding for the two columns of cells which are coupled to a given metal line is provided through left and right select transistors coupled to each drain-source-drain segment.

The unique left and right select transistors are each coupled to a set of rows of word lines as much as 64 high, to improve the reading speed and alleviate program disturbance concerns.

The array has been designed to provide for a conducting state for programmed cells, using negative word line voltages during page program operations. Also, during an erase operation, which has been configured to establish a non-conducting state for the cell, negative drain, source and substrate voltages are applied. Again, this reduces the disturbance problems and the magnitude of positive voltage needed to be applied during the operations. Finally, the array provides for redundant row and redundant column replacement configurations unavailable in prior art designs.

Other aspects and advantages of the present invention can be seen upon review of the figures, the detailed description, and the claims which follow.

BRIEF DESCRIPTION OF THE FIGURES

FIG. 4 is a schematic block diagram of a segmentable flash EPROM array with redundant rows for correction of failed rows in the main array.

FIG. 4A is a flow chart of a page program operation according to the present invention.

FIG. 4B is a simplified schematic showing program verify circuitry according to the present invention.

FIGS. 5A–5H illustrate the steps in manufacturing a first type of flash EPROM cell according to the present invention, with an extended floating gate for improved coupling ratio.

FIGS. 6A–6G illustrate the final six steps in a sequence which begins as set out in FIGS. 5A–5D, for implementing an alternative embodiment of the flash EPROM cells according to the present invention.

FIGS. 8–14 are mask layouts for implementing the flash EPROM segment of FIG. 7, in which:

FIG. 8 illustrates the layout of a first diffusion and a field oxide isolation in the substrate.

FIG. 9 illustrates the region of a p+ type cell implant for raising the threshold voltage in the cells of the array.

FIG. 10 illustrates the layout of a first polysilicon layer.

FIG. 11 illustrates the layout of a second polysilicon layer.

FIG. 12 illustrates the layout of a third polysilicon layer.

FIG. 13 illustrates the positioning of metal contacts.

FIG. 14 illustrates the layout of the overlying metal lines for the subarray.

DETAILED DESCRIPTION

Figure 1:
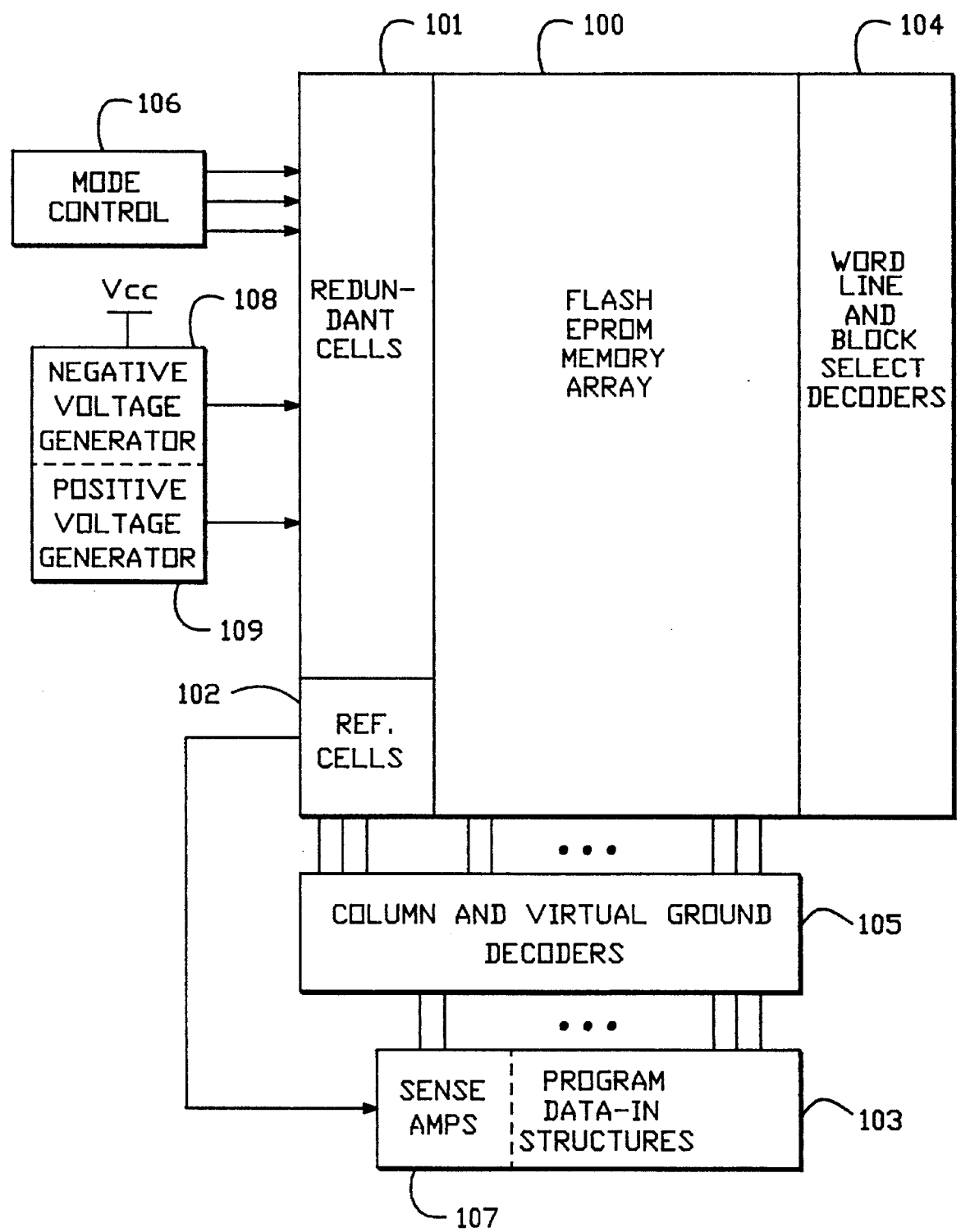
FIG. 1 is a schematic diagram of a flash EPROM integrated circuit module according to the present invention.

A detailed description of preferred embodiments of the present invention is provided with respect to the figures, in which FIG. 1 provides an overview of the layout of a flash EPROM integrated circuit module according to the present invention. Thus, the integrated circuit module of FIG. 1 includes a flash EPROM memory array 100 coupled to a plurality of redundant memory cells 101 used for replacing failed cells in the main array as known in the art. A plurality of reference cells 102 are used with sense amps 107 for differential sensing the state of the cells in the memory array.

Coupled to the memory array 100 are word line and block select decoders 104 for horizontal decoding in the memory array. Also coupled to the memory array 100 are the column decoder and virtual ground circuit 105 for vertical decoding in the array.

Coupled to the column decoder and virtual ground circuit 105 are the program data in structures 103. Thus, the sense amps 107 and the program data in structures 103 provide data in and out circuitry coupled to the memory array.

The flash EPROM integrated circuit typically is operated in a read only mode, a program mode, and an erase mode. Thus, mode control circuitry 106 is coupled to the array 100.

Finally, according to one embodiment of the present invention, during the program and erase modes, a negative potential is applied to either the gate or source and drain of the memory cells. Thus, a negative voltage generator 108 and a positive voltage generator 109 are used for supplying various reference voltages to the array. The negative voltage generator 108 and positive voltage generator 109 are driven by the power supply voltage $V_{cc}$.

Figure 2:
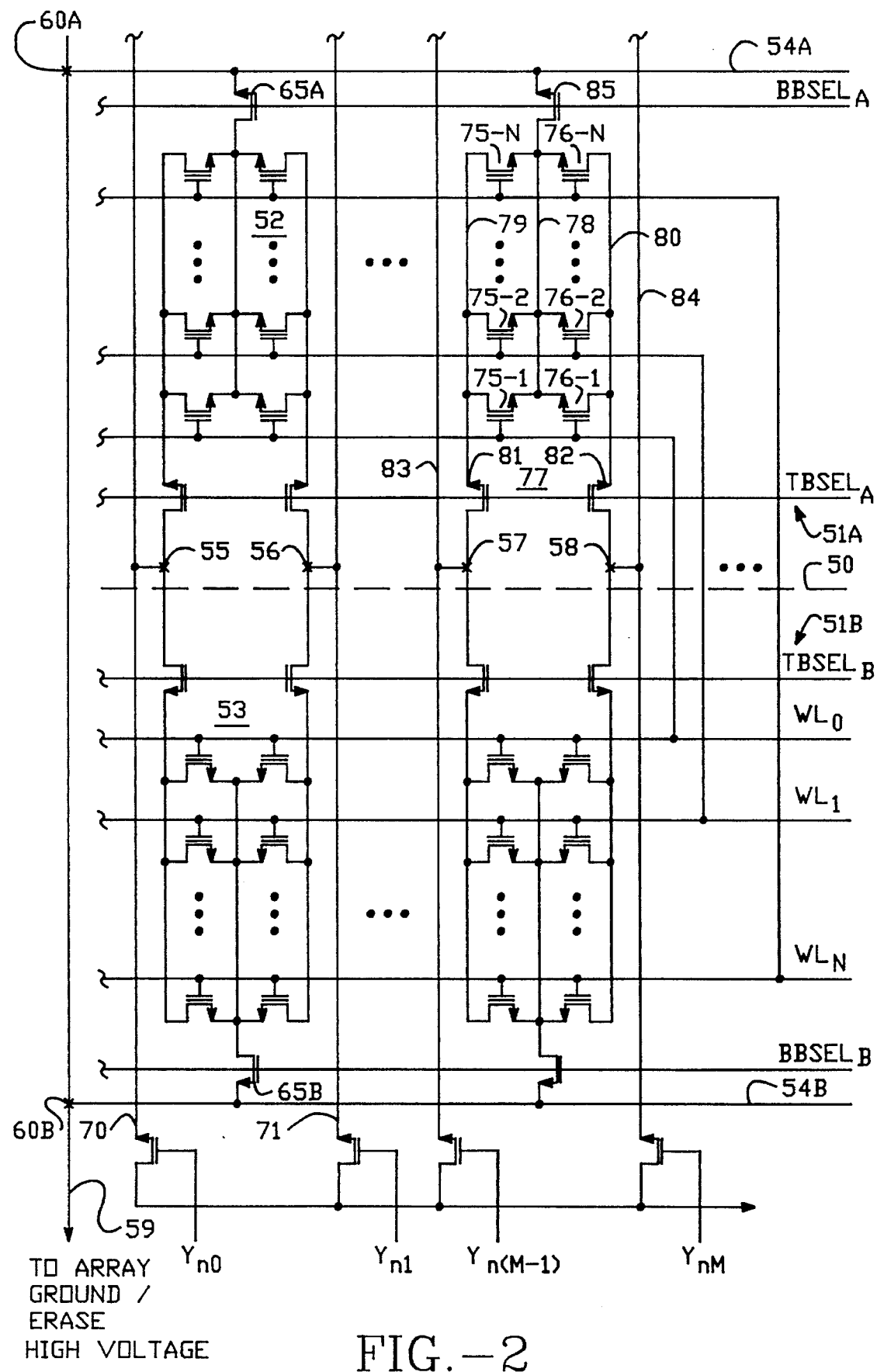
FIG. 2 is a schematic diagram of a drain-source-drain configured, virtual ground, flash EPROM array according to one embodiment of the present invention.

FIG. 2 illustrates two segments within a larger integrated circuit. The segments are divided generally along dotted line 50 and include segment 51A generally above the dotted line 50 and segment 51B generally below the dotted line 50. A first pair 52 of columns in segment 51A is laid out in a mirror image with a second pair 53 of columns in segment 51B along a given global bit line pair (e.g., bit lines 70, 71). As one proceeds up the bit line pair, the memory segments are flipped so as to share virtual ground conductors 54A, 54B (buried diffusion) and metal-to-diffusion contacts 55, 56, 57, 58. The virtual ground conductors 54A, 54B extend horizontally across the array to a vertical virtual ground metal line 59 through metal-to-diffusion contacts 60A, 60B. The segments repeat on opposite sides of the metal virtual ground line 59 so that adjacent segments share a metal virtual ground line 59. Thus, the segment layout of FIG. 2 requires two metal contact pitches per column of two transistor cells for the global bit lines and one metal contact pitch per segment for the metal virtual ground line 59.

Each of the pairs of columns (e.g., 52, 53) along a given bit line pair comprises a set of EPROM cells. Thus, cells 75-1, 75-2, 75-N comprise a first set of flash EPROM cells in a first one of the pair 77 of columns. Cells 76-1, 76-2, 76-N comprise a second set of flash EPROM cells in the second column in the pair 77 of columns.

The first set of cells and the second set of cells share a common buried diffusion source line 78. The cells 75-1, 75-2, 75-N are coupled to buried diffusion drain line 79. Cells 76-1, 76-2, 76-N are coupled to buried diffusion drain line 80. Selector circuitry comprising top select transistor 81 and top select transistor 82 couple the respective drain diffusion lines 79, 80 to metal global bit lines 83 and 84, respectively. Thus, the transistor 81 has a source coupled to the drain diffusion line 79 and a drain coupled to a metal contact 57. Transistor 82 has a source coupled to the drain diffusion line 80 and a drain coupled to the metal contact 58. The gates of transistors 81 and 82 are controlled by the signal $TBSEL_A$ to couple the respective columns of flash EPROM cells to the global bit lines 83 and 84.

The source diffusion line 78 is coupled to the drain of select transistor 85. The source of select transistor 85 is coupled to a virtual ground diffusion line 54A. The gate of transistor 85A is controlled by the signal $BBSEL_A$.

Furthermore, a sector of two or more segments as illustrated in FIG. 2 may share word line signals because of the additional decoding provided by the top and bottom block select signals $TBSEL_A$, $TBSEL_B$, $BBSEL_A$, and $BBSEL_B$. In one embodiment, eight segments share word line drivers, providing a sector eight segments deep.

As can be seen, the architecture according to the present invention provides a sectored flash EPROM array. This is beneficial because the source and drain of transistors in non-selected segments during a read, program or erase cycle may be isolated from the currents and voltages on the bit lines and virtual ground lines. Thus, during a read operation, sensing is improved because leakage current from segments not selected does not contribute to current on the bit lines. During the program and erase operations, the voltages of the virtual ground line, and the bit lines, are isolated from the unselected segments. This allows a sectored erase operation, either segment by segment or preferably sector by sector when the segments within a given sector share word line drivers.

Figure 3:
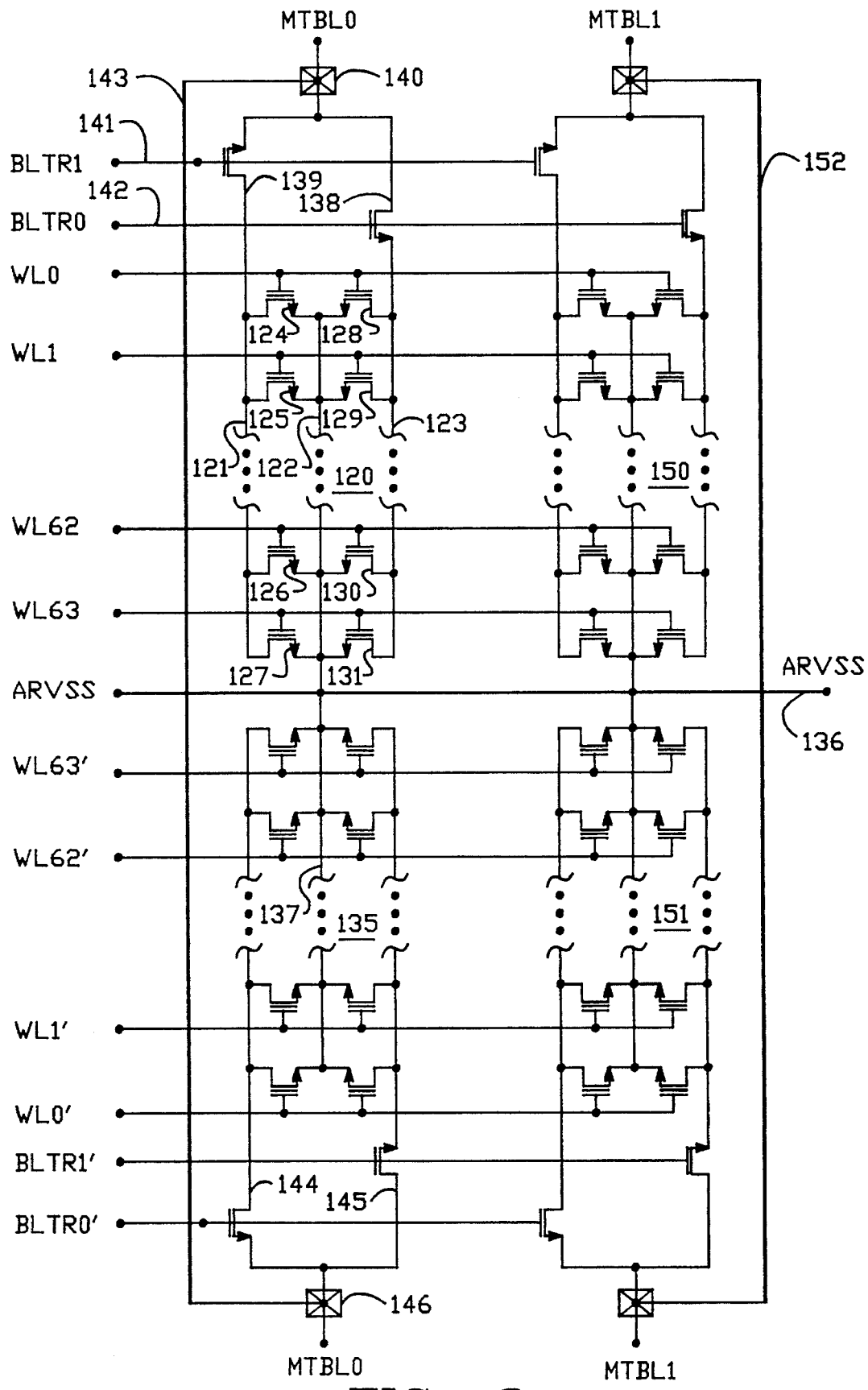
FIG. 3 is a schematic diagram of an alternative embodiment of the present invention with two columns of flash EPROM cells sharing a single metal bit line.

It will be appreciated that the bottom block select transistors (e.g., transistors 65A, 65B) may not be necessary in a given implementation as shown in FIG. 3 below. Also, these block select transistors may share a bottom block select signal with an adjacent segment. Alternatively, the bottom block select transistors (e.g., 65A, 65B) may be replaced by single isolation transistors adjacent the virtual ground terminals 60A, 60B.

FIG. 3 illustrates an alternative architecture of the flash EPROM array according to the present invention, in which two columns of flash EPROM cells share a single metal bit line. FIG. 3 shows four pairs of columns of the array, where each pair of columns includes flash EPROM cells in a drain-source-drain configuration.

Thus, the first pair 120 of columns includes a first drain diffusion line 121, a source diffusion line 122, and a second drain diffusion line 123. Word lines WL0 through WL63 each overlay the floating gates of a cell in a first one of the pairs of columns and a cell in the second one of the pairs of columns. As shown in the figure, a first pair 120 of columns includes one column including cell 124, cell 125, cell 126, and cell 127. Not shown are cells coupled to word lines WL2 through WL61. The second one of the pair 120 of columns includes cell 128, cell 129, cell 130, and cell 131. Along the same column of the array, a second pair 135 of columns is shown. It has a similar architecture to the pair 120 of columns except that it is laid out in a mirror image.

Thus, as can be seen, the transistor in the first one of the pair of columns, such as the cell 125, includes a drain in drain diffusion line 121, and a source in the source diffusion line 122. A floating gate overlays the channel region between the first drain diffusion line 121 and the source diffusion line 122. The word line WL1 overlays the floating gate of the cell 125 to establish a flash EPROM cell.

The column pair 120 and column pair 135 share an array virtual ground diffusion 136 (ARVSS). Thus, the source diffusion line 122 of column pair 120 is coupled to the ground diffusion 136. Similarly, the source diffusion line 137 of column pair 135 is coupled to the ground diffusion 136.

As mentioned above, each pair 120 of columns of cells shares a single metal line. Thus, a block right select transistor 138 and a block left select transistor 139 are included. The transistor 139 includes a drain in the drain diffusion line 121, a source coupled to a metal contact 140, and a gate coupled to the control signal BLTR1 on line 141. Similarly, the right select transistor 138 includes a source in the drain diffusion line 123, a drain coupled to the metal contact 140, and a gate coupled to the control signal BLTR0 on line 142. Thus, the select circuitry, including transistors 138 and 139, provides for selective connection of the first drain diffusion line 121 and a second drain diffusion line 123 to the metal line 143 (MTBL0) through metal contact 140. As can be seen, column pair 135 includes left select transistor 144 and right select transistor 145 which are similarly connected to a metal contact 146. Contact 146 is coupled to the same metal line 143 as is contact 140 which is coupled to column pair 120. The metal line can be shared by more than two columns of cells with additional select circuitry.

The architecture shown in FIG. 2 and 3 is based upon a drain-source-drain unit forming two columns of cells which are isolated from adjacent drain-source-drain units to prevent leakage current from adjacent columns of cells. The architecture can be extended to units of more than two columns, with appropriate tolerances for leakage current in the sensing circuitry, or other controls on current leakage from unselected cells. Thus, for instance, fourth and fifth diffusion lines could be added within a given isolated region to create a drain-source-drain-source-drain structure which provides four columns of cells.

Column pairs are laid out horizontally and vertically to provide an array of flash EPROM cells comprising M word lines and 2N columns. The array requires only N metal bit lines each of which is coupled to a pair of columns of flash EPROM cells through select circuitry, as described above.

Although the figure only shows four column pairs 120, 135, 150, and 151, coupled to two metal bit lines 143 and 152 (MTBL0–MTBL1), the array may be repeated horizontally and vertically as required to establish a large scale flash EPROM memory array. Thus, column pairs 120 and 150 which share a word line are repeated horizontally to provide a segment of the array. Segments are repeated vertically. A group of segments (e.g., eight segments) having respective word lines coupled to a shared word line driver may be considered a sector of the array.

The layout of the array is compact because of the virtual ground configuration, the reduced metal pitch requirement for the layout, and further by the ability to share word line drivers amongst a plurality of rows in different segments. Thus, word line WL63' may share a word line driver with word line WL63. In a preferred system, eight word lines share a single word line driver. Thus, only the pitch of one word line driver circuitry is needed for each set of eight rows of cells. The additional decoding provided by the left and right select transistors (139, 138 for segment 120) allows the shared word line configuration. The shared word line configuration has the disadvantage that during a sector erase operation, eight rows of cells all receive the same word line voltage, causing a word line disturbance in cells that are not desired to be erased. If it is a problem for a given array, this disturbance problem can be eliminated by insuring that all sector erase operations decode for segments including all rows of cells coupled to the shared word line drivers, For eight word lines sharing a single driver, a minimum sector erase of eight segments may be desired.

FIG. 4 is a schematic block diagram of a flash EPROM array meant to illustrate certain features of the present invention. Thus, the flash EPROM memory module shown in FIG. 4 includes a main flash EPROM array, including sectors 170-1, 170-2, 170-3, 170-N, each sector including eight segments (e.g., SEG0–SEG7). A plurality of sets of shared word line drivers 171-1, 171-2, 171-3, 171-N are used to drive the shared word lines of the eight segments in the respective sectors. As illustrated with respect to shared word line drivers 171-1, there are 64 shared drivers for sector 170-1. Each of the 64 drivers supplies an output on line 172. Each of these outputs is used to drive eight word lines in respective segments of the sector 170-1 as schematically illustrated in the figure by the division into eight sets of 64 lines.

Also coupled to the array are a plurality of block select drivers 173-1, 173-2, 173-3, 173-N. The block select drivers each drive a left and right block select signal for each segment. Where the segments are implemented as shown in FIG. 3, there is a BLTR1 and BLTR0 block select signal pair supplied for each set of 64 word lines.

In addition, there are N global bit lines in the flash EPROM array. The N bit lines are used to allow access to the 2N columns of flash EPROM cells in the array for the data in circuitry and sense amps 191. The N bit lines 174 are coupled to a column select decoder 175. Similarly, the block select drivers 173-1 through 173-N are coupled to a block decoder 176. The shared word line drivers 171-1 through 171-N are coupled to row decoder 177. The column select decoder 175, block decoder 176, and row decoder 177 receive address signals on the address in line 178.

Coupled to the column select decoder 175 is page program buffer 190. The page program buffer 190 include N latches, one for each of the N bit lines. Thus, a page of data may be considered N bits wide, with each row of cells two pages, page 0 and page 1, wide. Pages in a given row are selected using the left and right decoding described above.

Selectable voltage sources 179 are used to supply the reference potentials for the read only, program, and erase modes for the flash EPROM array as conceptually illustrated in the figure, through the word line drivers 171-1 to 171-N and through the bit lines.

The virtual ground lines in the array are coupled to the virtual ground driver 181 which is coupled with the array. Also, p-well and n-well reference voltage sources 199 are coupled to the respective wells of the array.

Thus, as can be seen in FIG. 4, the 64 word line drivers, such as word line drivers 171-1, are used with 512 (64×8) rows in the array. The additional decoding provided by the block select drivers (e.g., 173-1) allow for the shared word line layout.

The architecture of the flash EPROM array, according to the present invention, allows for row redundancy as schematically illustrated in FIG. 4. Thus, the W bit lines extend from the main array across lines 182 to a redundant array including sectors 183-1 and 183-2. The redundant array is driven by the redundant word line drivers 184-1 and 184-2. Similarly, redundant block select drivers 185-1 and 185-2 are coupled to the redundant array.

If, during testing, a cell on a given row is found defective, that row and the seven other rows which share the word line driver may be replaced by corresponding rows in the redundant array 183-1 and 183-2. Thus, the system would include a content addressable memory (CAM) cell 198 with a redundant decoder 186 which receives the address data. As known in the art, during testing, failed rows in the main array are identified, and the address of such rows is stored in the CAM cell 198. When the address ADDR IN on line 178 matches the address stored in the CAM cell 198, then a match signal is generated on line 187. The match signal disables the shared word line drivers 171-1 through 171-N in the main array. The redundant decoder 186 drives the redundant word line drivers 184-1 and 184-2, and drives redundant block select drivers 185-1 and 185-2 to select the appropriate replacement row.

The redundant row decoding may also be coupled with redundant column decoding, as known in the art, to provide a flash EPROM array with much greater manufacturing yield.

The column select decoder 175 is coupled to the page program latches 190, including at least one latch for each of the N bit lines. Also, the column select decoder 175 is coupled to the data in circuitry and sense amps 191. Together, these circuits provide data in and out circuitry for use with the flash EPROM array.

Redundant row decoding also provides capability of correcting for shorts between adjacent word lines. In particular, when two word lines are shorted, two word lines must be replaced with corresponding two word lines in the redundant array. In the embodiment described, where there are eight word lines sharing a common word line driver, two sets of eight word lines are used to replace a corresponding two sets of eight word lines in the main array. Thus, the two shorted word lines in the main array can be repaired with row redundancy.

The cells in the preferred embodiment are configured for a sector erase operation that causes charging of the floating gate (electrons entering the floating gate) such that upon sensing an erased cell, the cell is non-conducting and the output of the sense amp is high. Also, the architecture is configured for a page program which involves discharging a floating gate (electrons leaving the floating gate) such that upon sensing, a programmed cell is conducting.

The operation voltages for the programming operation are positive 5 volts to the drain of a cell to be programmed to a low (data= 0) threshold condition, negative 10 volts to the gate, and 0 volts or floating of the source terminal. The substrate or the p-well 200 shown in FIGS. 5G and 6H is grounded. This results in a Fowler-Nordheim tunneling mechanism for discharging the floating gate.

The erase operation is executed by applying negative 6 volts to the drain, positive 12 volts to the gate, and negative 6 volts to the source. The p-well 200 is biased at negative 6 volts. This results in a Fowler-Nordheim tunneling mechanism to charge the floating gate. The read potentials are 1.2 volts on the drain, 5 volts on the gate, and 0 volts on the source.

This sets up the ability to do a sector erase using word line decoding to select cells to be erased. The erase disturbance condition for unselected cells within a segment results in −6 volts on the drain, 0 volts on the gate, and −6 volts on the source. This is well within the tolerances of the cells to withstand these potentials without causing significant disturbance of the charge in the cell.

Similarly, the program disturbance conditions, for cells which share the same bit line in the same segment are 5 volts on the drain, 0 volts on the gate, and 0 volts or floating on the source. There is no gate to drain drive in this condition and it does not disturb the cell significantly.

For cells which share the same word line but not the same bit line or an addressed cell which is to remain in a high condition, the disturbance condition is 0 volts on the drain, −10 volts on the gate, and 0 volts or floating on the source. Again, this condition does not result in significant deterioration of the charge in the unselected cells.

The two well technology is critical so that the negative voltage can be applied to the drain and source diffusion regions. Without the negative voltages on the source and drain, the gate potential for a cell with a 50% coupling ratio, requiring about 9 volts across the floating gate/drain junction, must be about 18 volts. These very high voltages on integrated circuits require specially designed circuits and special process technology. Similarly, the negative voltage on the gate allows lower positive potentials on the drain for the program operation.

FIG. 4A is a flow chart illustrating the program flow for the flash EPROM circuit of FIG. 4. The process begins by erasing the sector (e.g., sector 170-1) into which data is to be programmed (block 600). After erasing the sector, an erase verify operation is executed (block 601). Next, the page number, either 0 or 1, and the segment number, 1–8, is set by the host processor in response to the input address (block 602).

After setting the page number and segment number, the page buffer is loaded with the data for the page (block 603). This page buffer may be loaded with an entire N bits of data, or a single byte of data, as suits a particular program operation. Next, a verify operation is executed, in case the user does not pre-erase, to determine which cells need programming (block 604). After loading the page buffer, the program potentials are applied to the segment being programmed (block 605). After the program operation, a verify operation is executed in which the page is verified. In the verify operation, the bits in the page buffer which correspond to successfully programmed cells are turned off (block 606). Next, the algorithm determines whether all page bits are turned off in the page buffer (block 607). If they are not all off, then the algorithm determines whether a maximum number of retries has been made (block 610), and if not, loops to block 605 to program the page again, such that the failed bits are reprogrammed. The bits which pass are not reprogrammed because the corresponding bits in the page buffer were reset to 0 during the verify operation. If the maximum number of retries has been made at block 610, then the algorithm hangs up, signaling an unsuccessful operation.

If at block 607, all page bits were off, then the algorithm determines whether the sector has been finished, that is, whether both pages of the sector are to be written and both are completed (block 608). This is a CPU determined parameter. If the sector is not finished, then the algorithm loops to block 602 and updates the appropriate one of the page number or segment number.

If the sector has been finished at block 608, then the algorithm is done (block 609).

As mentioned with respect to block 605 of FIG. 4A, the program verify circuitry involves resetting on a bit by bit basis, the data in the page buffer which passes erase verify. Thus, a structure such as shown in simplified form in FIG. 4B is included in the flash EPROM. The sense amps 650 of the array are coupled to a compare circuitry 651. The inputs to the compare circuitry are the page buffer latches 652. Thus, a byte of data from the sense amps is compared against a corresponding byte from the page buffer. A pass/fail signals for the byte are fed back to a bit reset on the page buffer 652. Thus, bits which pass are reset in the page buffer. When all bits in the page buffer are reset, or a set number of retries of the program operation has been accomplished, then the program operation is complete.

Figure 5H:
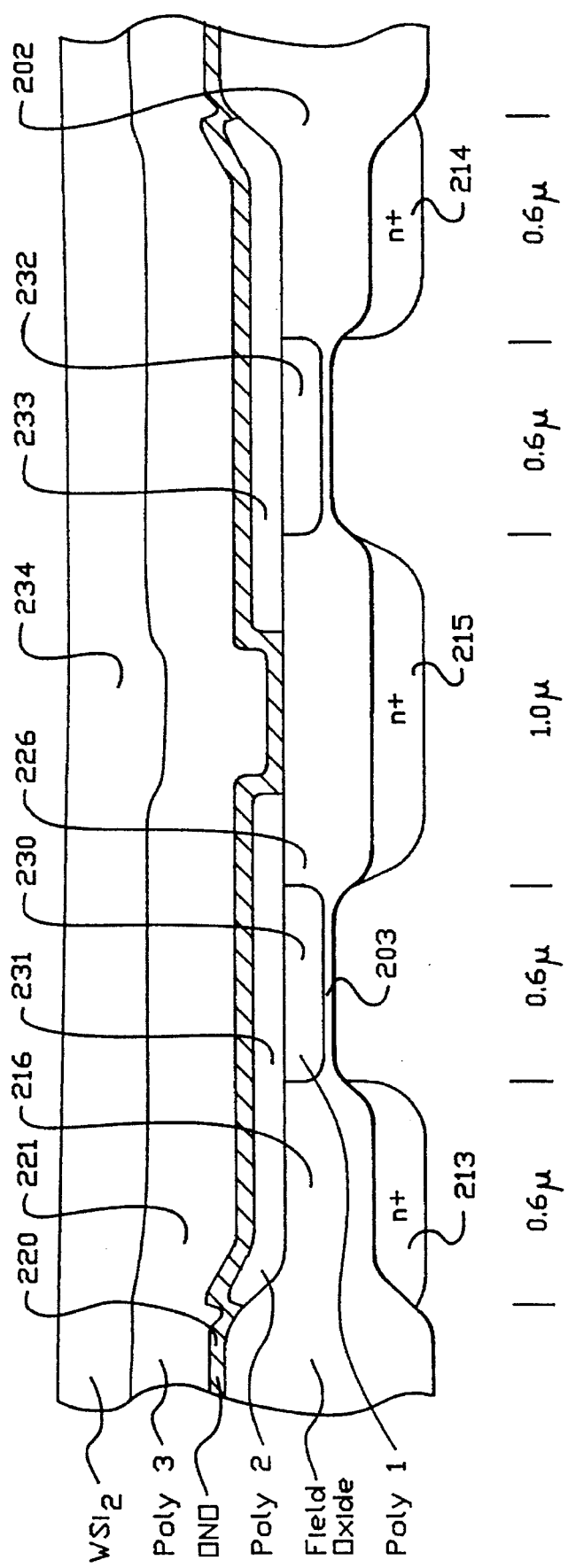

FIGS. 5A–5H illustrate manufacturing steps for a flash EPROM array according to one embodiment of the present invention. FIGS. 5A–5G are not drawn to scale. FIG. 5H is an approximate scale drawing to provide perspective for the resulting structure. FIGS. 6A–6G provide an alternative approach to manufacturing the flash EPROM cell, which involves the same initial steps, as illustrated in FIGS. 5A–5D. As with FIG. 5H, FIG. 6G is an approximate scale drawing of the resulting structure. FIGS. 7 and 8–14 are used to describe the layout of a three word line by six column test array for the embodiment described with respect to FIGS. 5A–5H, and FIG. 3.

The process of FIGS. 5A–5H will be described first. The cell is fabricated using a 0.6 micron CMOS double metal, triple well (two wells in the array, a third for peripheral circuitry), and triple poly technology. The primary steps involved in manufacturing the cell are shown in FIGS. 5A–5H.

FIG. 5A illustrates the first step in the process. Starting with a p-type silicon substrate 200 (or region of the substrate), a deep n-type well 198, around 6 microns in depth is formed. Next, a p-well 199, around 3 microns in depth, is formed inside the n-well.

The deep n-well 198 is formed first by implanting an n-type dopant into the substrate where the n-well region is defined by a photoresist mask. After implant, the photo mask is removed and the substrate is annealed at high temperature for a relatively long time to drive in and activate the n-type dopant to form the deep well. Then, a similar process is formed to implement a p-well inside the deep n-well.

In the next step, a well known LOCOS field oxidation process is used to grow relatively thick field oxide regions 201 and 202 which are elongated in a direction perpendicular to the page. Also, a sacrificial oxide layer is grown and then removed to prepare the surface of the p-well 199 for subsequent steps.

As illustrated in FIG. 5B, a thin tunnel oxide 203 is grown about 90Å thick. As illustrated in FIG. 5C, a first layer poly 204 is deposited of about 800Å on top of the tunnel oxide 203. Then, a thin nitride layer 205 of about 200Å is deposited on top of the poly layer 204.

As illustrated in FIG. 5D, a photomasking process is used to define the floating gates, and n+ source and drain diffusion regions. Thus, photomask layers 206, 207 are defined to protect the floating gate regions in poly one 204. The poly one 204 and nitride layers 205 are etched away except as protected by the masks 206 and 207 to expose the drain, source and drain regions. Next, n-type dopants are implanted in the p-well 199 as illustrated at arrows 208 within the exposed regions. These regions are therefore self-aligned to the floating gate in poly one 204 and to the field isolation regions 201 and 202.

As illustrated in FIG. 5E, the substrate is annealed to activate the dopants and define the drain diffusion regions 213 and 214, and the source diffusion region 215. Also, drain oxides 216, 217 and source oxide 218 of about 2,000Å are grown, along with oxides 225 and 226 covering the sides of the floating gate poly 204.

In the next step, the nitride layer 205 on the floating gates is removed and then a second layer 219 of poly (poly two) is deposited over the first layer. The second layer 219 is about 800Å thick and deposited on top of poly one. This layer is implanted with an n-type dopant.

As shown in FIG. 5F, a photomasking process is used to define the poly two pattern, which in turn defines the effective floating gate area as seen from the control gate to be deposited in poly three. The effective floating gate area is increased by the poly two deposition so that the coupling ratio is high enough and preferably about or larger than 50%. During following high temperature annealing steps, the n-type dopants will uniformly distribute between poly two and poly one layers, resulting in very low resistance contact between the two layers.

As illustrated in FIG. 5G, an ONO layer 220 is grown on top of the poly two layer. The ONO layer is about 180Å thick. Finally, a third poly layer 221 (poly three) is deposited on top of the ONO and, after deposition of tungsten silicide as shown in FIG. 5H, etched to define the word line for the memory cells.

FIG. 5H illustrates the layer of tungsten silicide 234 over the poly three layer 221 used to improve the conductivity of the word lines. FIG. 5H is an approximate scale sketch of the structure of the resulting cell. According to the process of FIGS. 5A–5H, the drain diffusion region 213 is formed in a region between the field oxide 202 and the poly one layer of the floating gate 230, which is about 0.6 microns wide. Similarly, the poly one portion of the floating gate 230 is about 0.6 microns wide. The source diffusion region between floating gate regions 230 and 232 is approximately 1.0 microns wide. The drain diffusion region 214 is approximately 0.6 microns wide.

The 1.0 micron wide source diffusion region 215 is formed slightly wider to allow for alignment tolerances for the poly two deposition process. With a more controlled alignment process, the width of the source diffusion region 215 can be reduced.

The vertical dimensions of the various elements are shown in approximate scale in FIG. 5H. Thus, the tunnel oxide 203 under the poly one portion of the floating gate electrode 230 or 232 is approximately 90 angstroms thick. The poly one deposition 230 is approximately 800 angstroms thick. The oxide region 216 over the drain diffusion region 213, and similarly the oxides over the source diffusion region 215 and drain diffusion region 214 as grown are approximately 2,000 to 2,500 angstroms thick, but as finished are in the range of 1,000 to 1,500 angstroms.

The side wall oxide 226 on the poly one portion of floating gate 230 is in the range of 600 angstroms thick. As can be seen in the sketch, it merges with the thermal oxide 216 over the source or drain diffusion region as appropriate.

The thickness of the second poly deposition 231 is approximately 800 angstroms. The thickness of the ONO layer 220 is approximately 180 angstroms. The third poly layer 221 is approximately 2,500 angstroms thick. The tungsten silicide layer 234 is approximately 2,000 angstroms thick. The field oxide region 202 in the finished product is in the range of 6,500 to 5,000 angstroms thick.

FIG. 5H illustrates a feature of the process of FIGS. 5A–5H. As can be seen, in FIG. 5G, the second poly deposition 233 only partially covers the drain diffusion region 214. In FIG. 5H, an alternative mask is used to extend the poly two portion of the floating gate across the drain diffusion region partially overlapping the field oxide region 202. This variability in the process allows the coupling ratio of the floating gate to be varied as suits the needs of a particular design by extending its length out over the field oxide region.

Metallization and passivation layers (not shown) are deposited over the circuit of FIG. 5H.

Thus, as can be seen in FIG. 5H, a floating gate structure for a drain-source-drain configured flash EPROM segment is provided which consists of a first layer polysilicon 230 and a second layer polysilicon 231. The first layer poly 230 is used for self-alignment of the source and drain diffusion regions. The second layer poly 231 is used to extend the floating gate surface area to increase the coupling ratio of the cell.

In the drain-source-drain configuration, it can be seen that the floating gate consisting of poly one layer 230 and poly two layer 231 for the cell on the left side, and the floating gate consisting of poly one layer 232 and poly two layer 233 for the cell on the right side of the figure are essentially mirror images. This allows for extension of the floating gate out over the drain diffusion regions in the drain-source-drain configuration, without shorting over the shared source diffusion region substantially.

The cell technology and layout has a number of merits. The tunnel oxide is grown before the array source/drain implant. Thus, oxide thickening and dopant depletion effects are minimized. The source and drain implant of the memory cell is self-aligned to the poly one pattern. Thus, the channel length of the cell can be well controlled.

There is a relaxed metal design rule can be used with the flash array, particularly in the architecture of FIG. 3. The source block transistor merges with the memory cell source/drain diffusion in the cell layout. This overlap region provides interconnection between these two diffusion areas. The field oxide is used to isolate the bit line pairs from neighboring bit lines. Inside the bit line pair, the structure is flat.

Also, for the cell illustrated in FIGS. 5A–5H, the effective gate coupling area seen from the control gate is determined by the area of the second layer of poly. Therefore, a reasonably high gate coupling ratio can be achieved by extending the second layer of poly over the buried diffusion or field oxide regions to compensate for the low gate coupling ratio which would be provided by only the first layer of poly. Further, by extending the length of the extension of the second layer of poly out over the diffusion regions and isolation regions, different gate coupling ratios can be easily achieved to meet different product applications.

An alternative cell structure is illustrated with respect to FIGS. 6A–6G. This structure begins with the same manufacturing steps as shown in FIGS. 5A–5D above. Thus, as can be seen in FIG. 6A, the sequence proceeds from the structure of FIG. 5D by first removing the masks 206 and 207, and then depositing a nitride layer 250 over the region. The nitride layer coats the sides of the floating gate poly 204 as illustrated in the figure.

In the next step, as shown in FIG. 6B, an anisotropic etch is used to remove the deposited nitride layer 250, except for those portions of the layer on the top and sides of the floating gate poly 204.

The etch may leave a small amount of nitride on the edges of the field oxide regions 201, 202. However, this is not important to the process.

After the anisotropic etch of the nitride, the wafer is annealed to drive-in the dopants to form the drain diffusion regions 213 and 214 and the source diffusion region 215. Also, the thermal oxides 216, 217, and 218 are grown over the drain diffusion regions and the source diffusion region, respectively. The nitride layers 205 and 250 protect the floating gate poly 204 from oxide formation.

In the next step, as shown in FIG. 6C, the nitride remnants of the layer 205 and the layer 250 are removed from the structure, exposing the poly one floating gate elements 204.

In the next step, as shown in FIG. 6D, a second poly deposition 219 is deposited on the structure. This second layer poly 219 is deposited to a thickness of about 1,500 to 2,000 angstroms and implanted with an n-type dopant.

As shown in FIG. 6E, poly spacers 240 and 241 are formed along the edges of the poly one pattern using a self-aligned plasma etching of the poly two layer.

During following high temperature steps, the n-type dopants in the poly two deposition will distribute evenly between the poly one and poly two elements, and provide good electrical contact.

As illustrated in FIG. 6F, an ONO layer 220 is deposited over the floating gate structures formed of the poly one element, 242, and the poly two spacers 240 and 241. Also, a region of polysilicon 243 may be left adjacent the field oxide region 201 in this process. However, there is no electrical contact in this region and it should not have an affect on the operation of the device. After deposition of the ONO layer 220, a third poly layer 221 is deposited having a thickness of about 2,500 angstroms to form the word lines for the device.

FIG. 6G illustrates the last step in the process of depositing a layer of tungsten silicide 234 having a thickness of about 2,000 angstroms over the poly three word line 221 to improve the conductivity of the structure.

FIG. 6G is also an approximate scale sketch of the structure. Thus, as can be seen, the drain diffusion regions 213 and 214 are formed in a region between a field oxide 202 and the floating gate 204 of about 0.6 microns in width. The floating gate poly one deposition 204 is about 0.15 microns in thickness. Also the source diffusion region 215 formed between the poly one floating gates is about 0.6 microns in this embodiment. The narrower source diffusion region 215 as compared to that of FIG. 5H, is possible in this approach because of the self-aligned nature of the poly two spacers 240 and 241. There is no need in a layout of a structure as shown in FIG. 6G to provide for mask misalignment tolerances necessary for aligning the mask to form the poly two floating gate extensions of FIG. 5H. This makes the structure of FIG. 6G scalable, as process dimensions shrink, without requirement for allowing for mask misalignment tolerances.

The thicknesses of the regions in the vertical dimensions are similar to those of FIG. 5H. However, the poly one deposition 242 is about 1,500 to 1,600 angstroms thick. The spacers 240 and 241 extend about 2,000 angstroms out over the source and drain diffusion regions.

In an alternative process for making a structure such as shown in FIG. 6G, the second nitride layer 250 is not deposited. However, during the anneal step of FIG. 6B, oxide will grow on the side of the poly one deposition. These oxides on the sides of the poly can be etched away, so that contact between poly one and poly two may be provided in the subsequent steps. However, the etching of the oxide on the side of the poly one portion of the floating gate, will risk etching of the oxide between the floating gate and the substrate. If this region is etched too far, then a short may occur during the poly two deposition to the substrate. Thus, the procedure illustrated in FIG. 6A–6G may be preferred for many applications.

The polysilicon used in the described structure for the floating gate can be replaced with amorphous silicon.

Figure 7:
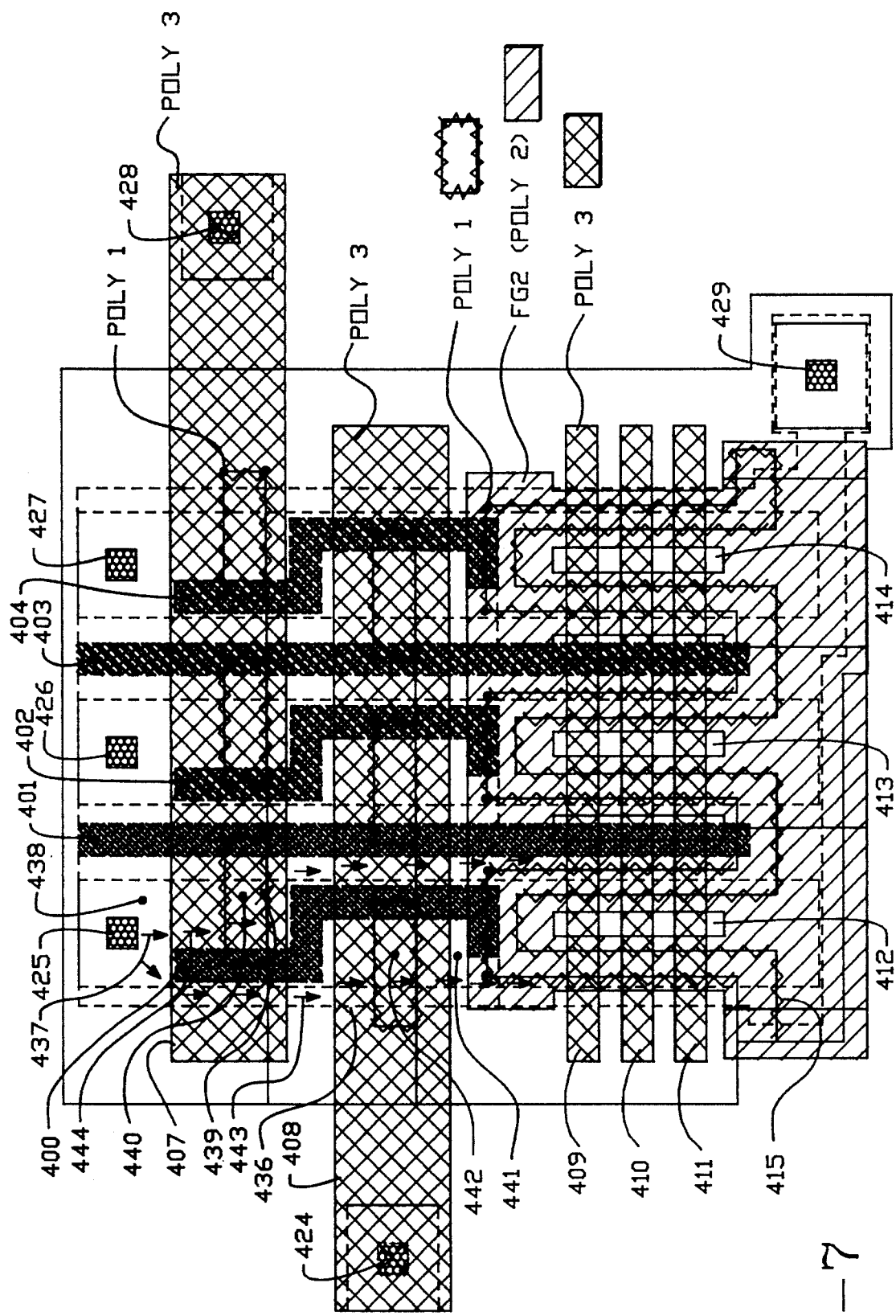
FIG. 7 provides a perspective of the layout of a flash EPROM segment according to the present invention.

For a better understanding of the layout of the integrated circuit according to the present invention, FIGS. 7–14 are used to describe the layout of a test array which is 6 columns by 3 word lines in size. FIG. 7 is a composite view which will be understood better with reference to the layout views of FIGS. 8–14. As can be seen in FIG. 7, the test array includes five field isolation regions 400, 401, 402, 403, and 404. The layout of these isolation regions can be seen with reference to FIG. 8 where the field oxide regions are marked with reference numerals 400–404, and the hatched region 405 corresponds to an active region inside the p-type well 199 of FIG. 5G.

FIG. 9 illustrates the layout of a p-type implant which is used to raise the threshold voltage VT of the memory cells. The implant in area 406 causes a higher initial VT for the memory cells in the block than for the select transistors (in regions circled by lines 436 and 437 of FIG. 7).

The array also includes the poly three control lines 407 and 408 for the right and left select transistors for each of the three segments, respectively. FIG. 7 also shows three word lines 409, 410, and 411 which overlay three segments of the array. The first layer poly is illustrated in FIG. 7 by the bold outline 415 and is also more clearly seen in FIG. 10. There are segments 416, 417, 418, 419, 420, and 421 in the first layer poly, as illustrated in FIG. 10, used for self-alignment of the left and right select transistors. These segments are later removed, after formation of the source and drain regions of the cells. Thus, FIG. 10 illustrates the masking for the poly one deposition. Poly one is deposited and etched inside the region defined by the line 415, and in the regions surrounding the layout on FIG. 10, to establish the first layer poly of the floating gates of FIG. 5G.

FIG. 11 illustrates the masking pattern for the second layer poly for the cell illustrated in FIG. 5G. Regions 412, 413, and 414 are apparent in FIG. 7. Regions 422 and 423 correspond to segments of the floating gate poly over the field isolation areas 401 and 403 of FIG. 7. Poly two is later patterned to establish the extended floating gate of FIG. 5G.

Figure 12:
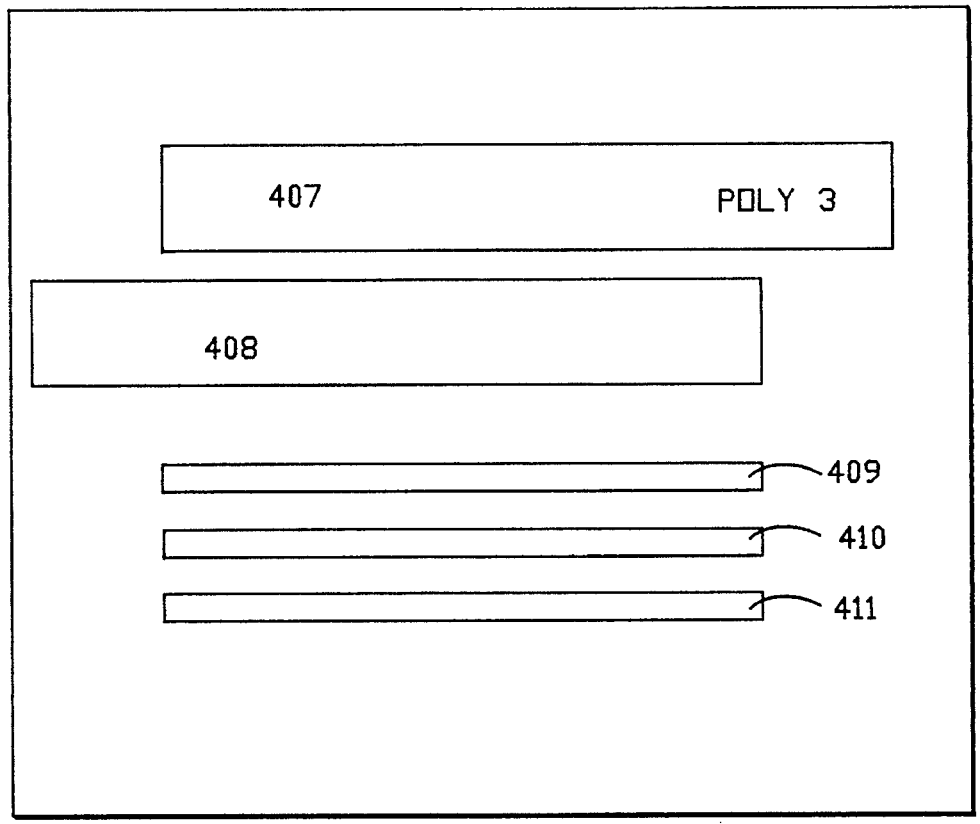

FIG. 12 illustrates the layout of the poly three control lines 407 and 408 and the word lines 409, 410, and 411.

Figure 13:
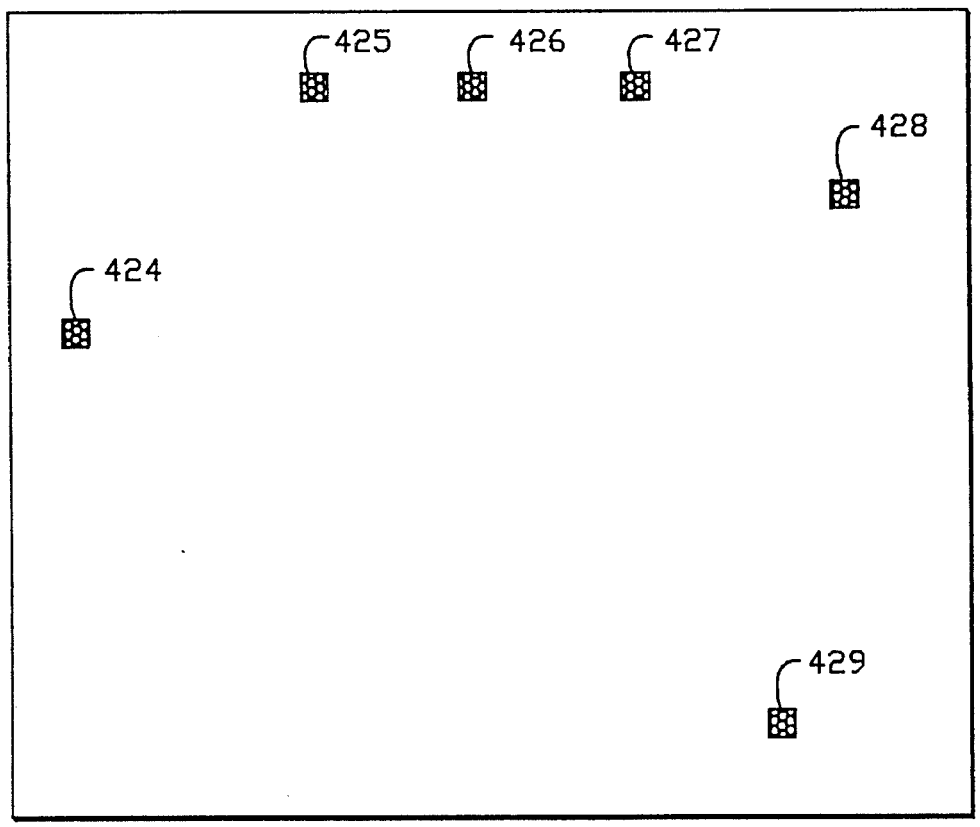

FIG. 13 illustrates the metal contacts 424, 425, 426, 427, 428, and 429 in the test array. The contact 424 is used to contact the poly three control line 408. The contact 428 is used for making a metal contact to the poly three control line 407. Contacts 425, 426, and 427 are used for making contact from the diffusion region of the select transistors to the metal global bit lines which overlay the array (not shown in FIG. 7). Contact 429 is used for making contact to the array source diffusions. The layout of the metal lines is shown in FIG. 14. As can be seen, they align with the contacts 425, 426, and 427 and overlay the segments in the array. Thus, metal bit line 430 is coupled to contact 425, metal bit line 431 is coupled to contact 426 and metal bit line 432 is coupled to contact 427. The metal pads 433 and 434 are coupled to contacts 428 and 424, respectively. The metal pad 435 is coupled to contact 429.

Thus, in the sequence a field isolation and diffusion step is shown in FIG. 8. Next, a VT enhancement implant step is carried out in the region 406 shown in FIG. 9. Next, the floating gate poly is laid down. In addition, the segments 416 through 421 are laid down with poly one to establish the channels for the left and right block select transistors. Then a source/drain implant is executed to form the drain-source-drain structure and the buried diffusions for the left and right block select transistors and the virtual ground terminal. After this implant, the poly two is deposited, as illustrated in FIG. 11. Poly two is patterned as described above to establish the extended floating gates. An insulating layer is placed over poly two and the third layer of poly is deposited with a pattern as shown in FIG. 12. Finally, isolation is deposited over the poly three layer, the metal contacts are made, and the metal bit lines are deposited overlaying the array.

As can be seen in FIG. 7, the left select transistor underlies the control line 408 in the region circled by line 436. Similarly, the right select transistor for the first segment underlies the control line 407 in the region circled by line 437. The contact 425 reaches a diffusion region 438. The diffusion region 438 is isolated from a diffusion region 439 by the masked area 440 which was defined by the poly one deposition. Similarly, the diffusion region 438 is isolated from diffusion region 441 by the masked area 442 which was masked by the poly one deposition. Thus, a select transistor for the left column is established across the channel defined by region 442. The diffusion region 441 is within or coupled to the drain diffusion region for the segment. Similarly, the diffusion region 439 is within or coupled to the right side drain diffusion region for the segment.

The current path from the contact 425 to the left diffusion region for the segment is illustrated by the arrow line 443. As can be seen, this path is interrupted by the transistor channel in the region 442. Thus, the control line 408 provides for connection of the left drain diffusion region to the contact 425.

The current path for the right block select transistor is illustrated by the arrow line 444. As can be seen, this path is interrupted by the channel in the region 440. The two select transistors in the regions 436 and 437, thus provide for selective connection of the contact 425 to either the left or right diffusion region. This way, two columns of flash EPROM cells are selectively coupled to a single metal bit line via contact 425.

As will be appreciated by those skilled in the art, the mask sequence of FIGS. 8–14 will be altered for the cell illustrated in FIG. 6H as concerns the poly 2 deposition steps. However, the basic layout of the array remains unchanged.

Accordingly, a new flash EPROM cell and array architecture have been provided. The architecture provides for a very dense core array obtained by unique cell layouts, where two adjacent local drain bit lines share one common source bit line. Also, the layout has been optimized to allow use of a single metal line for every two columns of cells in the array. Further, the layout is further reduced by shared word lines, so that the word line driver pitch does not impact the size of the main array. Sector erase is feasible using segmentable architecture of the present invention. Also, row redundancy is available for flash EPROM using this structure. A high performance, reliable flash memory array can be achieved using these technologies.

An n-channel embodiment of the flash EPROM array has been disclosed. Those skilled in the art will recognize that p-channel equivalent circuits can be implemented using techniques known in the art. Furthermore, the architecture has been designed with respect to flash EPROM cells. Many aspects of the architecture may be adapted to a variety of memory circuit arrays.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A floating gate memory module on a semiconductor substrate, comprising:

a memory array including at least M rows and at least 2N columns of floating gate memory cells;

M word lines, each coupled to the floating gate memory cells in one of the M rows of floating gate memory cells;

N global bit lines;

data in and out circuitry coupled to the N global bit lines which provide for reading and writing data in the memory array; and selector circuitry, coupled to the 2N columns of floating gate memory cells and to the N global bit lines, which provides for selective connection of two columns of the 2N columns to each of the N global bit lines so that access to the 2N columns of floating gate memory cells by the data in and out circuitry is provided across the N global bit lines.

2. The integrated circuit module of claim 1, wherein the 2N columns of floating gate memory cells in the memory array comprise:

N pairs of columns of floating gate memory cells, each pair of columns comprising a plurality of segments, each segment in the plurality comprising
two local bit lines coupled to the selector circuitry,
one local source line coupled to source reference circuitry,
a first set of floating gate memory cells in a first column of the pair of columns between one of the two local bit lines and the local source line,
a second set of floating gate memory cells in a second column of the pair of columns between the other of the two local bit lines and the local source line,
members of a subset of the M word lines each coupled to a floating gate memory cell in the first set and a floating gate memory cell in the second set; and
wherein the selector circuitry includes segment selector circuitry, coupled to the two local bit lines and at least one of the N global bit lines, which provides for selective connection of the first and second sets in the segment to the at least one of the N global bit lines.

3. The integrated circuit module of claim 2, including an insulating layer over the 2N columns, and wherein the N global bit lines overly the insulating layer, and the segment selector circuitry includes a contact through the insulating layer to a corresponding one of the N global bit lines, and circuitry coupled to the contact and to the two local bit lines to selectively connect the two local bit lines to the contact.

4. The integrated circuit module of claim 3, wherein the segment selector circuitry includes for each segment a first transistor having a first terminal in the first local bit line and a second terminal coupled to the contact, and second transistor having a first terminal in the second local bit line and a second terminal coupled to the contact.

5. The integrated circuit module of claim 1, including:
row decoder circuitry for driving the M word lines, the row decoder circuitry including fewer than M drivers, each of the fewer than M drivers driving a set of more than one of the M word lines in parallel when enabled by the row decoder circuitry.

6. The integrated circuit module of claim 1, wherein the semiconductor substrate has a substrate region of first conductivity type, a first well in the substrate region of a second conductivity type, and a second well of the first conductivity type in the first well, and wherein the floating gate memory cells have sources and drains formed in the second well to allow application of a negative potential to at least one of the source and drain during an operation to alter stored contents of the cells.

7. The integrated circuit module of claim 1, wherein there are more than 2N columns, and the selector circuitry provides for selective connection of more than 2 columns to at least one of the N global bit lines so that access to the more than 2N columns of floating gate memory cells by the data in and out circuitry is provided across the N global bit lines.

8. A floating gate transistor array in a substrate region of a first conductivity type in a semiconductor substrate, comprising:
a plurality of spaced apart, relatively thick insulating regions in the substrate elongated in a first direction to provide a plurality of isolated regions in the substrate region;
a plurality of first drain diffusion regions in respective isolated regions and elongated in the first direction, each aligned on one side with a respective one of the plurality of insulating regions;
a plurality of source diffusion regions in respective isolated regions, elongated in the first direction, and each spaced away from the first drain diffusion regions to provide a first channel region between the source and first drain diffusion regions in the respective isolated regions;
a plurality of second drain diffusion regions in respective isolated regions and elongated in the first direction each aligned on one side with a respective one of the plurality of insulating regions, and spaced away from the source diffusion region to provide a second channel region between the source and second drain diffusion regions in the respective isolated regions;
a first insulating layer over the substrate, over the first and second channel regions, over the source diffusion region, and over the first and second drain diffusion regions in the respective isolated regions;
a first plurality of floating gate electrodes over the first insulating layer over the first channel regions in the plurality of isolation regions;
a second plurality of floating gate electrodes over the first insulating layer over the second channel regions in the plurality of isolation regions;
a second insulating layer over the first and second pluralities of floating gate electrodes;
a plurality of word line conductors over the second insulating layer elongated in a second direction, each lying across the plurality of thick insulating regions, over the source diffusion regions, and the first and second drain diffusion regions, and overlying a floating gate electrode in the first plurality and a floating gate electrode in the second plurality, to form a plurality of pairs of floating gate transistors in the respective isolated regions having shared source diffusion regions;
a plurality of data conductors;
a plurality of select circuits, each having a contact to a respective one of the plurality of data conductors and coupled to a respective first drain diffusion region of the plurality of first drain diffusion regions and a respective second drain diffusion region of the plurality of second drain diffusion regions, which selectively gate current between the respective one of the plurality of data conductors and one of the respective first drain diffusion region and the respective second drain diffusion region; and
a reference conductor coupled to the plurality of source diffusion regions.

9. The floating gate transistor array of claim 8, further including:
a bit line insulating layer over the word lines, the data conductors overlying the bit line insulating layer.

10. The floating gate transistor array of claim 9, wherein the word lines comprise polysilicon, and the data conductors comprise metal.

11. The floating gate transistor array of claim 8, wherein at least one select circuit in the plurality of selects includes a contact to one of the plurality of data conductors, a first transistor having a first terminal in a corresponding first drain diffusion region and a second terminal coupled to the contact, and second transistor having a first terminal in a corresponding second drain diffusion region and a second terminal coupled to the contact.

12. The floating gate transistor array of claim 8, further including a first well of a second conductivity type in the substrate region and a second well of the first conductivity type in the first well, and wherein the plurality of first drain diffusion regions, the plurality of source diffusion regions and the plurality of second drain diffusion regions are formed within the second well to allow application of a negative potential to at least one of the source and drain during an operation to alter stored contents of the cells.

13. The floating gate transistor array of claim 8, wherein the floating gate transistors comprise flash EPROM cells.

14. A floating gate memory integrated circuit module on a semiconductor substrate having a substrate region of a first conductivity type, comprising:
a first well of a second conductivity type in the substrate region, and a second well of the first conductivity type in the first well;
an array including at least M rows and 2N columns of floating gate memory cells, wherein the 2N columns of floating gate memory cells comprise:
N pairs of columns of floating gate memory cells, each pair of columns comprising a plurality of segments, each segment in the plurality comprising
a first drain diffusion region elongated in the first direction in the second well;
a source diffusion region elongated in the first direction in the second well, and spaced away from the first drain diffusion region to provide a first channel region between the source and first drain diffusion regions;

a second drain diffusion region elongated in the first direction in the second well, and spaced away from the source diffusion region to provide a second channel region between the source and second drain diffusion regions;

a first insulating layer over the substrate, over the first and second channel regions, over the source diffusion region, and over the first and second drain diffusion regions;

a first plurality of floating gate electrodes over the first insulating layer over the first channel regions;

a second plurality of floating gate electrodes over the first insulating layer over the second channel regions; and a second insulating layer over the first and second pluralities of floating gate electrodes, so that each segment includes a first set of floating gate memory cells in a first one of the pair of columns and a second set of floating gate memory cells in a second one of the pair of columns;

M word lines, each coupled to the floating gate memory cells in one of the M rows of floating gate memory cells, members of a subset of the M word lines each coupled to a floating gate memory cell in the first set in a given segment and a floating gate memory cell in the second set in the given segment;

N global bit lines;

data in and out circuitry coupled to the N global bit lines which provide for reading and writing data in the 2N columns of floating gate memory cells;

selector circuitry, coupled to the first and second drain diffusion regions in the plurality of segments, and thereby to the 2N columns of floating gate memory cells and to the N global bit lines, which provides for selective connection of two columns of the 2N columns to each of the N global bit lines so that access to the 2N columns of floating gate memory cells by the data in and out circuitry is provided across the N global bit lines; and programming circuitry which applies a negative potential to word lines during an operation to discharge floating gate electrodes of selected floating gate memory cells and a negative potential to at least one of the source diffusion regions and drain diffusion regions during an operation to charge floating gate electrodes of selected floating gate memory cells.

15. The integrated circuit module of claim 14, wherein the segments further include a word line insulating layer over the first and second pluralities of floating gate electrodes, the word lines overlying the word line insulating layer; and a bit line insulating layer over the word lines, the global bit lines overlying the word line insulating layer.

16. The integrated circuit module of claim 15, wherein the word lines comprise polysilicon, and the global bit lines comprise metal.

17. The integrated circuit module of claim 14, wherein the selector circuitry includes for each segment, a contact through the insulating layers to a corresponding one of the N global bit lines, and circuitry coupled to the contact and to the first and second drain diffusion regions to selectively connect the first and second drain diffusion regions to the contact.

18. The integrated circuit module of claim 17, wherein the selector circuitry includes for each segment a first transistor having a first terminal in the first drain diffusion region and a second terminal coupled to the contact, and second transistor having a first terminal in the second drain diffusion region and a second terminal coupled to the contact.

19. The integrated circuit module of claim 14, including:

row decoder circuitry for driving the M word lines, the row decoder circuitry including fewer than M drivers, each of the fewer than M drivers driving a set of more than one of the M word lines in parallel when enabled by the row decoder circuitry, the set of word lines driven in parallel including at most one word line coupled to floating gate memory cells in a given one of the plurality of segments coupled to a given global bit line.

20. The integrated circuit module of claim 14, further including relatively thick insulating regions extending parallel to the first and second drain diffusion regions in the segments to isolate the segments.

21. The integrated circuit module of claim 14, further including a set of redundant segments, at least one redundant segment in the set coupled to the global bit line corresponding to each of the pairs of columns of floating gate memory cells, and redundant decoder circuitry coupled to the set of redundant segments programmable to replace one or more rows of cells from the 2N columns of cells the with one or more rows of cells in the set of redundant segments.

22. A floating gate memory integrated circuit module on a semiconductor substrate, comprising:

a memory array including at least M rows and N columns of floating gate memory cells;

M word lines, each coupled to the floating gate memory cells in one of the M rows of floating gate memory cells;

a plurality of bit lines, each coupled to the floating gate memory N columns of floating gate memory cells;

data in and out circuitry coupled to the plurality of bit lines which provides for reading and writing data in the memory array;

a redundant array including at least X rows and N columns of floating gate memory cells, the floating memory gate cells in the N columns of the redundant array coupled to the plurality of bit lines;

X redundant word lines, each coupled to the floating gate memory cells in one of the X rows of floating gate memory cells in the redundant array; and redundant decoder circuitry coupled to the X redundant word lines in the redundant array, programmable to replace one or more rows of cells from the memory array with one or more rows of cells in the redundant array.

23. The integrated circuit module of claim 22, wherein the N columns of floating gate memory cells in the memory array comprise:

N/2 pairs of columns of floating gate memory cells, each pair of columns comprising a plurality of segments, each segment in the plurality comprising:

two local bit lines coupled to the selector circuitry, one local source line coupled to source reference circuitry, a first set of floating gate memory cells in a first column of the pair of columns between one of the two local bit lines and the local source line, a second set of floating gate memory cells in a second column of the pair of columns between the other of the two local bit lines and the local source line, members of a subset of the M word lines each coupled to a floating gate memory cell in the first set and a floating gate memory cell in the second set so that members of a subset of the M rows include a floating gate memory cell in the first set and a floating gate memory cell in the second set, and segment selector circuitry, coupled to the two local bit lines and at least one of the N bit lines, which provides for selective connection of the first and second sets in the segment to the at least one of the plurality of bit lines; and further including:
    circuitry to disable the segment selector circuitry for at least a subset of the plurality of segments when the redundant decoder accesses the redundant array.

24. The integrated circuit module of claim 23, wherein the plurality of bit lines includes N/2 bit lines, and the segment selector circuitry for each segment is coupled to a single one of the N/2 bit lines, so that access to the N columns of floating gate memory cells by the data in and out circuitry is provided across N/2 bit lines.

25. The integrated circuit module of claim 24, including an insulating layer over the N columns, and wherein the N/2 bit lines overly the insulating layer, and the segment selector circuitry includes a contact through the insulating layer to a corresponding one of the N/2 bit lines, and circuitry coupled to the contact and to the two local bit lines to selectively connect the two local bit lines to the contact.

26. The integrated circuit module of claim 22, wherein the redundant array includes a set of redundant segments, at least one redundant segment in the set coupled to a bit line corresponding to each of the pairs of columns of floating gate memory cells, and the redundant decoder circuitry includes circuits coupled to the set of redundant segments programmable to replace one or more rows of cells from the N columns of cells the with one or more rows of cells in the set of redundant segments.

27. The integrated circuit module of claim 23, wherein the local bit lines and the local source line in the plurality of segments comprise buried diffusion regions in the semiconductor substrate.

28. The integrated circuit module of claim 27, wherein the segment selector circuitry includes for each segment a first transistor having a first terminal in the buried diffusion region of one of the local bit lines and a second terminal coupled to the contact, and second transistor having a first terminal in the buried diffusion region of the other one of the local bit lines and a second terminal coupled to the contact.

29. The integrated circuit module of claim 23, including:
    row decoder circuitry for driving the M word lines, the row decoder circuitry including fewer than M row drivers, each of the fewer than M row drivers driving a set of more than one of the M word lines in parallel when enabled by the row decoder circuitry, the set of word lines driven in parallel including at most one word line coupled to floating gate memory cells in a given one of the plurality of segments coupled to a given bit line; and wherein
    the redundant decoder includes drivers for replacing all rows driven by a given row driver in the memory array with rows in the redundant array.

30. A floating gate memory integrated circuit module on a semiconductor substrate, comprising:
    a memory array including a plurality of rows and a plurality of columns of floating gate memory cells;
    a plurality of word lines, each coupled to the floating gate memory cells in one of the rows of floating gate memory cells;
    N global bit lines;
    data in and out circuitry coupled to the plurality of global bit lines which provide for reading and writing data in the memory array; and
    the plurality of columns of floating gate memory cells including a number N of sets of columns, each set of columns comprising
        a first diffusion region elongated in a first direction;
        a second diffusion region elongated in the first direction, and spaced away from the first diffusion region to provide a first channel region between the first and second diffusion regions;
        a third diffusion region elongated in the first direction, and spaced away from the second diffusion region to provide a second channel region between the second and third diffusion regions;
        a first insulating layer over the substrate, over the first and second channel regions, and over the first, second and third diffusion regions;
        a first plurality of floating gate electrodes over the first insulating layer over the first channel region;
        a second plurality of floating gate electrodes over the first insulating layer over the second channel region; and
        a second insulating layer over the first and second pluralities of floating gate electrodes,
    so that two columns within the set share the second diffusion region; and
    selector circuitry, coupled to the N sets of columns in the plurality of columns of floating gate memory cells and to the N global bit lines, which provides for selective connection of columns of floating gate memory cells to global bit lines, so that access to the plurality of columns of floating gate memory cells by the data in and out circuitry is provided across the N global bit lines, and the selector circuitry provides for sharing one of the N global bit lines among the columns in each of the N sets of columns.

31. The floating gate memory integrated circuit module of claim 30, wherein at least one of said sets of columns includes at least a fourth diffusion region elongated in the first direction spaced away from the third diffusion region to form a third channel region, and a third plurality of floating gate electrodes over the over the third channel region, so that two columns within the set share the third diffusion region.

32. The floating gate memory integrated circuit module of claim 30, wherein at least one of said sets of columns includes
    a fourth diffusion region elongated in the first direction spaced away from the third diffusion region to form a third channel region, and a third plurality of floating gate electrodes over the over the third channel region;
    a fifth diffusion region elongated in the first direction spaced away from the fourth diffusion region to form a fourth channel region, and a fourth plurality of floating gate electrodes over the over the fourth channel region;
    so that the set includes four columns of cells in which the first diffusion region provides a drain, the second diffusion region provides a source, the third diffusion region provides a drain, the fourth diffusion region provides a source and the fifth diffusion region provides a drain.

33. The floating gate memory integrated circuit module of claim 30, wherein the selector circuitry includes set selector circuitry, coupled to the first and third diffusion lines for a given set of columns, and to one of the N global bit lines, which provides for selective connection of the first and third diffusion lines to the one of the N global bit lines.

34. The floating gate memory integrated circuit module of claim 30, including an insulating layer over the plurality of columns, and wherein the N global bit lines overly the insulating layer, and the selector circuitry includes for each of said N sets of columns a contact through the insulating layer to a corresponding one of the N global bit lines, and circuitry coupled to the contact and to the first and third diffusion lines to selectively connect the two diffusion lines to the contact.

35. The floating gate memory integrated circuit module of claim 34, wherein the selector circuitry includes for each set of columns a first transistor having a first terminal in the first diffusion region and a second terminal coupled to the contact, and second transistor having a first terminal in the third diffusion region and a second terminal coupled to the contact.

36. The floating gate memory integrated circuit module of claim 30, including:

row decoder circuitry for driving the plurality of word lines, the row decoder circuitry including a number of drivers, each of the drivers driving a set of more than one of the plurality of word lines in parallel when enabled by the row decoder circuitry.

* * * * *